United States Patent
Obuchi et al.

(10) Patent No.: US 6,563,890 B2
(45) Date of Patent: May 13, 2003

(54) MAXIMUM A POSTERIORI PROBABILITY DECODING METHOD AND APPARATUS

(75) Inventors: Kazuhisa Obuchi, Kawasaki (JP); Tetsuya Yano, Kawasaki (JP); Kazuo Kawabata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/923,602

(22) Filed: Aug. 7, 2001

(65) Prior Publication Data

US 2002/0015457 A1 Feb. 7, 2002

(30) Foreign Application Priority Data

Mar. 1, 1999 (JP) .................................. PCT/JP99/00963

(51) Int. Cl.$^7$ ................................................ G21C 23/00
(52) U.S. Cl. ......................... 375/341; 714/794; 714/795
(58) Field of Search ................................ 375/262, 265, 375/341; 714/746, 751, 750, 752, 755, 794, 795, 796, 786, 791

(56) References Cited

U.S. PATENT DOCUMENTS

| | | | |
|---|---|---|---|
| 5,446,747 A | | 8/1995 | Berrou |
| 6,028,897 A | * | 2/2000 | Wang .......................... 375/265 |
| 6,161,209 A | * | 12/2000 | Moher ......................... 375/262 |
| 6,263,467 B1 | * | 7/2001 | Hladik et al. ................ 714/751 |
| 6,339,834 B1 | * | 1/2002 | Crozier et al. ............... 714/701 |
| 6,353,900 B1 | * | 3/2002 | Sindhushayana et al. ... 714/701 |
| 6,430,722 B1 | * | 8/2002 | Eroz et al. ................... 714/755 |

FOREIGN PATENT DOCUMENTS

| | | |
|---|---|---|
| JP | 9507634 | 7/1997 |
| WO | PCT/IB95/00912 | 10/1995 |

OTHER PUBLICATIONS

J. Hsu, et al. A Parallel Decoding Scheme For Turbo Codes. National Tsing Hua University. Mar. 1998 pp. IV445–448.
Jianming Yuan, et al. Multiple Output Sliding Window Decoding Algorithm For Turbo Codes. University of Virginia. pp. 515–520.
Stevens S. Pietrobon. Implementation And Performance Of A Turbo/Map Decoder. International Journal of Satellite Communications. 1998. pp. 23–46.
Andrew J. Viterbi. An Intuitive Justification And A Simplified Implementation Of The Map Decoder For Convolutional Codes. IEEE Journal on Selected Areas in Communications. vol. 16 No. 2 Feb. 1998.
S. Benedetto, et al. Soft–Output Decoding Algorithms In Iterative Decoding Of Turbo Codes. TDA Progress Report Feb. 15, 1996. pp. 63–87.
Shunsuke Ochi, et al. Fast Decoding Of Turbo–Code By Processing Map Algorithm In Parallel. Tokyo Institute of Technology. 1998. pp. 1–6.

* cited by examiner

Primary Examiner—Chi Pham
Assistant Examiner—Emmanuel Bayard
(74) Attorney, Agent, or Firm—Katten, Muchin, Zavis Rosenman

(57) ABSTRACT

In a decoding method of maximum a posteriori probability, (1) backward probabilities are calculated in a reverse direction from an Nth backward probability to a first backward probability, an math backward probability, $m_{(s-1)}$th backward probability, . . . , $m_2$th backward probability are saved discretely, an $m_1$th backward probability to the first backward probability are saved continuously, first forward probability is calculated, a first decoded result is obtained using the first forward probability and the saved first backward probability, and second to $m_1$th decoded results are obtained in similar fashion. (2) Thereafter, backward probabilities up to an $(m_1+1)$th backward probability are calculated and saved starting from the saved $m_2$th backward probability, $(m_1+1)$th forward probability is calculated, an $(m_1+1)$th decoded result is obtained using the $(m_1+1)$th forward probability and the saved $(m_1+1)$th backward probability, $(m_1+2)$th to $m_2$th decoded results are obtained in similar fashion and (3) $(m_2+1)$th to Nth decoded results are subsequently obtained in similar fashion.

8 Claims, 30 Drawing Sheets

FIG. 11
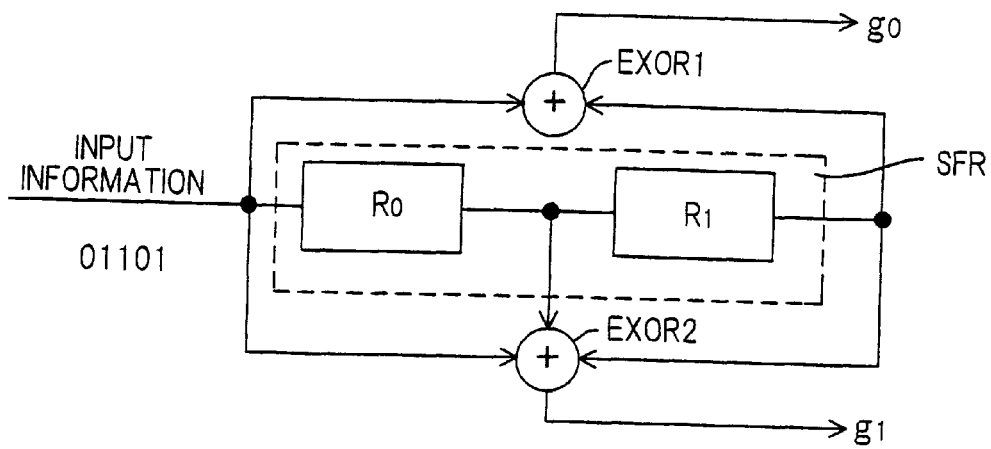
FIG. 12
| INPUT | INITIAL STATE : | SHIFT REGISTER | | OUTPUT | |
|---|---|---|---|---|---|
| | | 0 | 0 | $g_0$ | $g_1$ |
| 0 | → | 0 | 0 | 0 | 0 |
| 1 | → | 1 | 0 | 1 | 1 |
| 1 | → | 1 | 1 | 1 | 0 |
| 0 | → | 0 | 1 | 1 | 0 |
| 1 | → | 1 | 0 | 0 | 0 |
STATE
FIG. 13
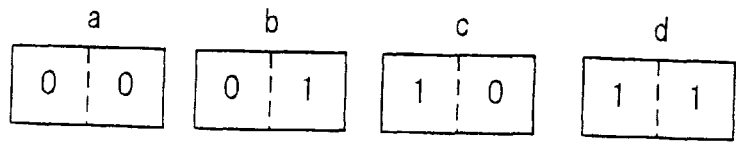

FIG. 15
(a)
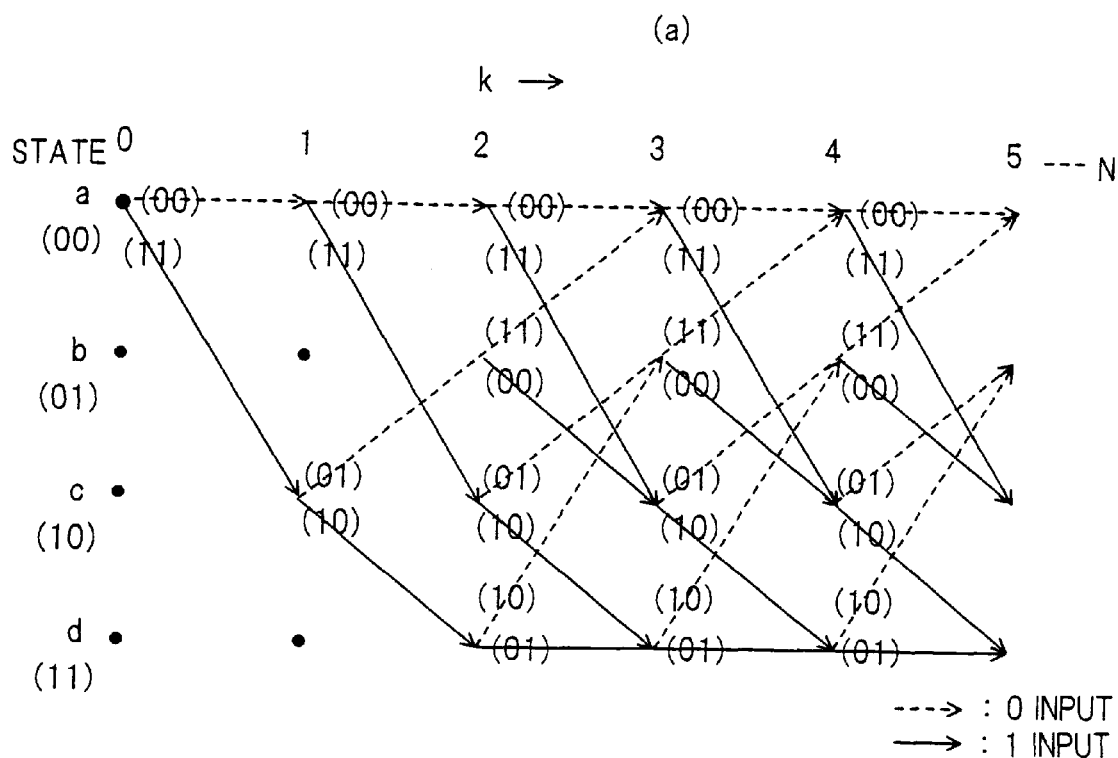
---> : 0 INPUT
——> : 1 INPUT
(b)
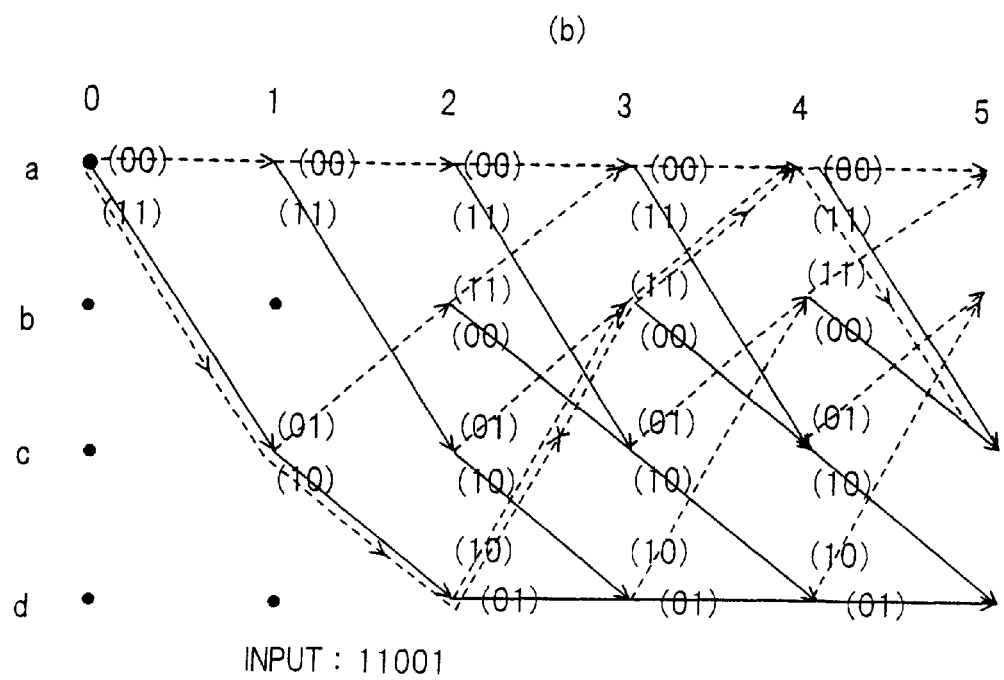
INPUT : 11001

(a)

(b)

| 1 | 1 | 1 | 0 | 0 | 0 | ----- RECEIVE DATA A (HARD DECISION) |
| 0 | 0 | 0 | 0 | 0 | 0 | DATA OUTPUT B ASSUMING PATH (1) |
| 1 | 1 | 1 | 0 | 0 | 0 | ----- A ⊕ B    ∴ HAMMING DISTANCE = 3 |

(c)

| 1 | 1 | 1 | 0 | 0 | 0 | ----- RECEIVE DATA A (HARD DECISION) |
| 1 | 1 | 0 | 1 | 1 | 1 | ----- DATA OUTPUT B ASSUMING PATH (2) |
| 0 | 0 | 1 | 1 | 1 | 1 | ----- A ⊕ B    ∴ HAMMING DISTANCE = 4 |

FIG. 24
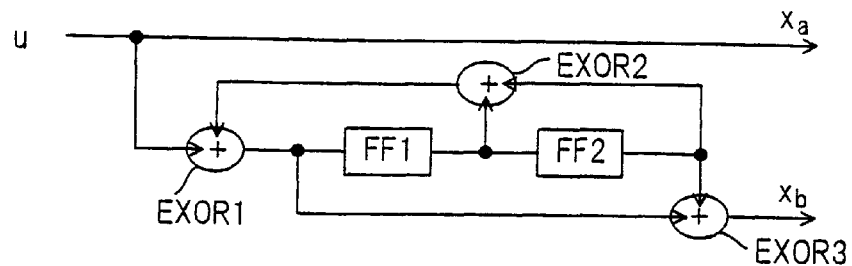
FIG. 25
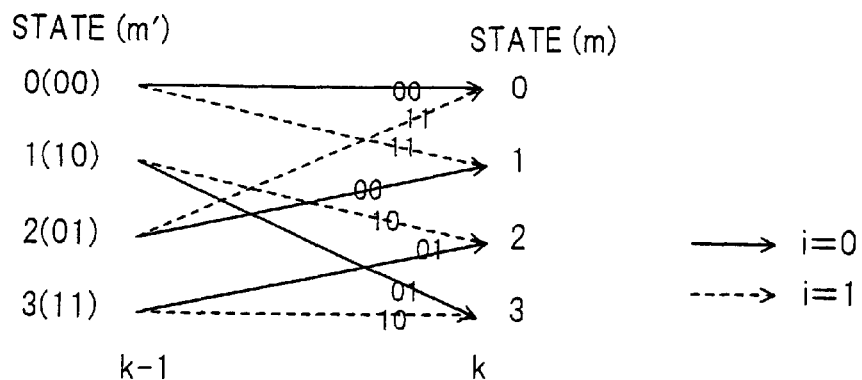
FIG. 26
| | $\gamma_1(R_k, m', m)$ | = | p | · | q | · | π | | |
|---|---|---|---|---|---|---|---|---|---|
| ○ | $\gamma_0(R_k, 0, 0)$ | = | ? | · | 1 | · | 1/2 | = | ? |
| | $\gamma_0(R_k, 1, 0)$ | = | ? | · | 0 | · | 0 | = | 0 |
| | $\gamma_0(R_k, 2, 0)$ | = | ? | · | 0 | · | 1/2 | = | 0 |
| | $\gamma_0(R_k, 3, 0)$ | = | ? | · | 0 | · | 0 | = | 0 |
| | $\gamma_1(R_k, 0, 0)$ | = | ? | · | 0 | · | 1/2 | = | 0 |
| | $\gamma_1(R_k, 1, 0)$ | = | ? | · | 0 | · | 0 | = | 0 |
| ○ | $\gamma_1(R_k, 2, 0)$ | = | ? | · | 1 | · | 1/2 | = | ? |
| | $\gamma_1(R_k, 3, 0)$ | = | ? | · | 0 | · | 0 | = | 0 |

FIG. 35
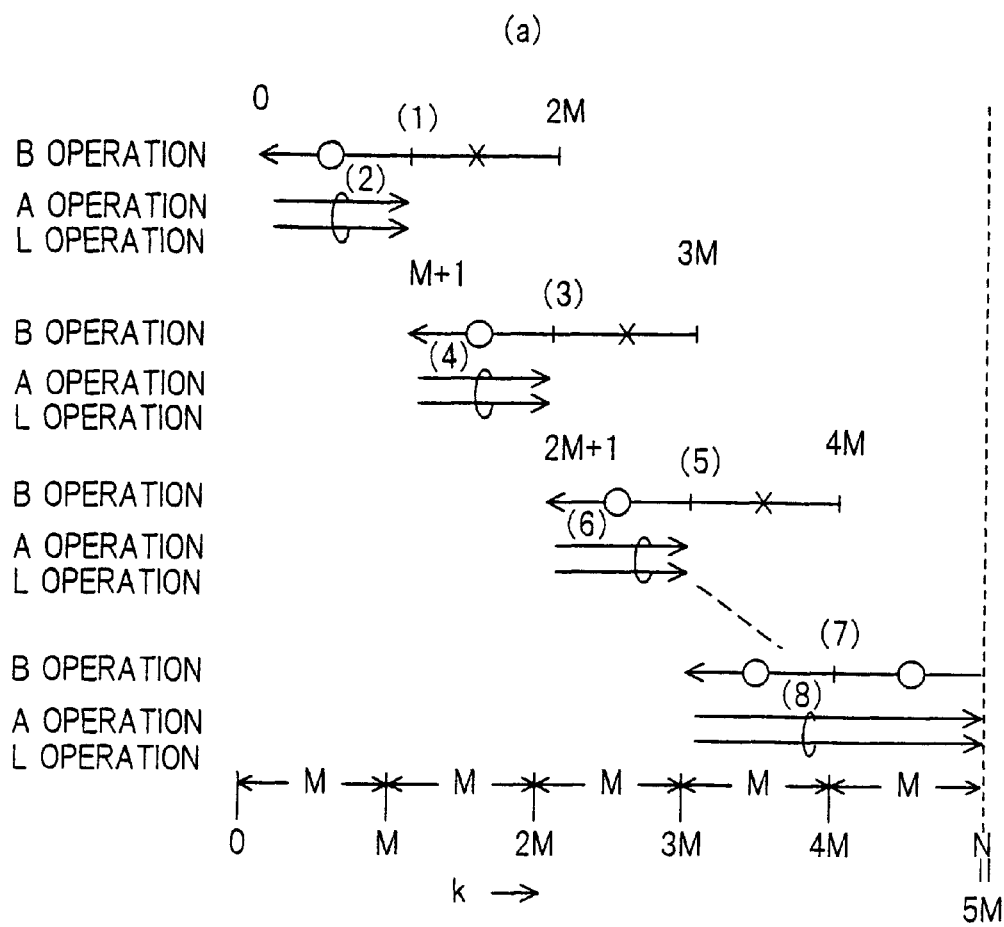
(a)
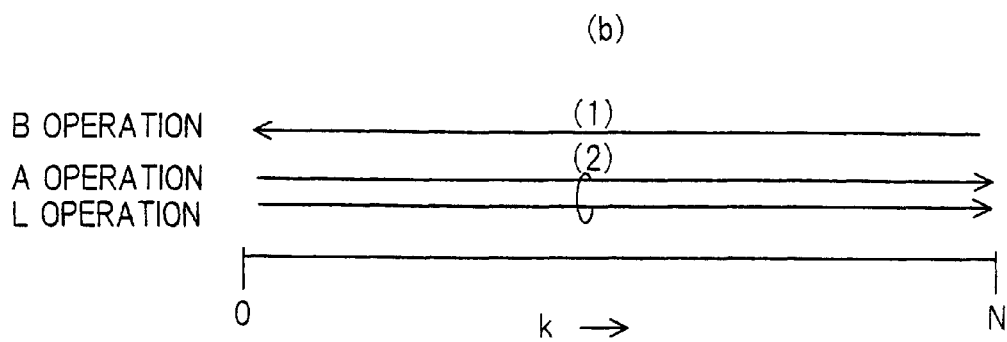
(b)

MAXIMUM A POSTERIORI PROBABILITY DECODING METHOD AND APPARATUS

TECHNICAL FIELD

This invention relates to a maximum a posteriori probability (MAP) decoding method and to a decoding apparatus that employs this decoding method. More particularly, the invention relates to a maximum a posteriori probability decoding method and apparatus for calculating backward probability and then calculating forward probability in maximum a posteriori probability decoding, thereby reducing amount of memory used.

BACKGROUND ART

Error correction codes, which are for the purpose of correcting errors contained in received information or in reconstructed information so that the original information can be decoded correctly, are applied to a variety of systems. For example, error correction codes are applied in cases where data is to be transmitted without error when performing mobile communication, FAX or other data communication, and in cases where data is to be reconstructed without error from a large-capacity storage medium such as a magnetic disk or CD.

Among the available error correction codes, it has been decided to adopt turbo codes (see the specification of U.S. Pat. No. 5,446,747) for standardization in next-generation mobile communications. Maximum a posteriori probability decoding (MAP decoding) manifests its effectiveness in such turbo codes. A MAP decoding method is a method of decoding that resembles Viterbi decoding.

(a) Viterbi Decoding

Using a kth item of data of encoded data obtained by encoding information of information length N, Viterbi decoding selects, for each state prevailing at the moment of input of the kth item of data, whichever of two paths that lead to the state has the smaller error, discards the path having the larger error, thenceforth, and is similar fashion, selects, for each state prevailing at the moment of input of a final Nth item of data, whichever of two paths that lead to the state has the smaller error, and performs decoding using the paths of smallest error among the paths selected at each of the states. The result of decoding is a hard-decision output.

Since the Viterbi decoding method is a method of decoding convolutional codes, convolutional encoding will be described first and then Viterbi decoding will be described.

FIG. 11 shows an example of a convolutional encoder, which has a 2-bit shift register SFR and two exclusive-OR gates EXOR1, EXOR2. The EXOR1 outputs the exclusive-OR $g_0$ between an input and $R_1$, and the EXOR2 outputs the exclusive-OR $g_1$ (outputs "1" when "1" is odd and outputs "0" otherwise) between the input and $R_0$, $R_1$. Accordingly, the relationship between the input and outputs of the convolutional encoder and the states of the shift register SFR in an instance where the input data is 01101 are as illustrated in FIG. 12.

The content of the shift register SFR of the convolutional encoder is defined as the "state". As shown in FIG. 13, there are four states, namely 00, 01, 10 and 11, which are referred to as state a, state b, state c and state d, respectively. With the convolutional encoder of FIG. 11, the outputs ($g_0$,$g_1$) and the next state are uniquely defined depending upon which of the states a through d is indicated by the state of the shift register SFR and depending upon whether the next item of input data is "0" or "1". FIG. 14 is a diagram showing the relationship between the states of the convolutional encoder and the inputs and outputs thereof, in which the dashed lines indicate a "0" input and the solid lines a "1" input.

(1) If "0" is input in state a, the output is 00 and the state is a; if "1" is input, the output is 11 and the state becomes c.

(2) If "0" is input in state b, the output is 11 and the state is a; if "1" is input, the output is 00 and the state becomes c.

(3) If "0" is input in state c, the output is 01 and the state becomes b; if "1" is input, the output is 10 and the state becomes d.

(4) If "0" is input in state d, the output is 10 and the state becomes b; if "1" is input, the output is 01 and the state becomes d.

If the convolutional codes of the convolutional encoder shown in FIG. 11 are expressed in the form of a lattice using the above input/output relationship, the result is as shown in FIG. 15(a), where k signifies the time at which a kth bit is input and the initial (k=0) state of the encoder is a(00). The dashed line indicates a "0" input and the solid line a "1" input, and the two numerical values on the lines are the outputs ($g_0$, $g_1$). Accordingly, it will be understood that if "0" is input in the initial state a(00), the output is 00 and the state is state a, and that if "1" is input, the output is 11 and the state becomes state c.

Upon referring to this lattice-like representation, it will be understood that if the original data is 11001, state c is reached via the path indicated by the dashes arrows in FIG. 15(b), and that the outputs of the encoder become

11→10→10→11→11

When a convolutional code is decoded, first a decision concerning the received data is rendered. There are two types of decisions, namely a hard decision and a soft decision.

In the case of a hard decision, the decision is rendered on the basis of two quantization levels, i.e., "1" is decided if the detected output level is larger than 0 and "0" is decided if the detected output level is less than 0. If a standardized determination is made is this fashion, an erroneous decision occurs at the spreading portion (the portion indicated by the hatched area) of the skirts of the respective probability density functions shown in FIG. 16.

A soft decision compensates for this disadvantage of the hard decision. The detected output is quantized at eight levels, as indicated by one example on the left side of FIG. 16, likelihood weighting conforming to each level is applied and the results of the decisions are output to a decoder.

With Viterbi decoding, a hard-decision input and a hard-decision output as well as a soft-decision input and a hard-decision output are possible. The former will be described first.

If the ideal error-free state is assumed, in which the hard-decision receive data ($g_0$,$g_1$) is 11→10→10→11→11, a path indicated by the dashed arrows shown in FIG. 17(a) is obtained. By making the dashed lines "0"s and the solid lines "1"s, the decoded result 11001 can be obtained, as illustrated in FIG. 17(b). In actuality, however, there are many cases where the receive data contains an error. If the fifth bit develops an error so that the hard-decision receive data ($g_0$,$g_1$) is 11→10→00→11→11, confusion occurs at time k=2 as to whether to branch to 10 or 01 (error count ERR=1). If 10 is construed to be the state and the upper path is selected, state c is reached without confusion at k=3 and k=4. Accordingly, the error count becomes error count ERR=1 on the dashed-arrow path and the decoded result at this time becomes 11001. On the other hand, if 01 is construed to be the state and the lower path is selected at time k=2, then confusion occurs at time k=3 also as to where to branch and total error count ERR=2 is the result. Thereafter, and in similar fashion, paths are selected and, when branching confusion occurs, ERR is counted up. The following results are eventually obtained:

total error count ERR when decoded result is 11001: 1
total error count ERR when decoded result is 11100: 2
total error count ERR when decoded result is 11110: 3
total error count ERR when decoded result is 11111: 3

Accordingly, the decoded result 11001 for which the error count ERR is smallest is selected and output. If this arrangement is adopted, the original data 11001 can be detected correctly even if the receive data is erroneous.

Though the foregoing relates to hard-decision receive data, decoding can be executed in similar fashion in the case of soft-decision receive data as well. FIG. 18 is a diagram useful in describing decoding in the case of soft-decision receive data. Assume that the soft-decision receive data $(g_0, g_1)$ is 1,1→1,0→1,0→2/8,1→1,1, as indicated at (b). Referring to the lattice-type representation shown at (a), it will be appreciated that confusion occurs at time k=3 as to whether to branch to 11 or 00. If 11 is construed to be the state and the upper path is selected (error count ERR=6/8), state c is reached without confusion at k=4. Accordingly, the error count becomes error count ERR=6/8 on the dashed-arrow path and the decoded result at this time becomes 11001. On the other hand, if 00 is construed to be the state and the lower path is selected at time k=3 (error count ERR=1+2/8), then confusion occurs at time k=4 also as to where to branch and total error count ERR=(2+2/8) is the result. Thereafter, and in similar fashion, paths are selected and, when branching confusion occurs, ERR is counted up. The following results are eventually obtained:
total error count ERR when decoded result is 11001:6/8
total error count ERR when decoded result is 11010:2+2/8
total error count ERR when decoded result is 11011:2+2/8
Accordingly, the decoded result 11001 for which the error count ERR is smallest is selected and output. If this arrangement is adopted, the original data 11001 can be detected correctly even if the receive data is erroneous. Thus, the soft decision is the same as the hard decision; the error count just is no longer an integer.

Processing for thus obtaining the error counts ERR of all possible paths based upon the receive data and decoding the original data from the path for which the error count is smallest is complicated. Accordingly, Viterbi decoding is performed as set forth below. It will be assumed that the receive data is 111000 as the result of a hard decision. At state a where k=3 in FIG. 18, there are two input paths. If only the relevant paths are extracted and drawn, the result is as shown in FIG. 19(*a*). The two paths are path (1) and path (2) shown in the drawing. If the hamming distances between the receive data and the decoded data obtained on respective ones of the paths are calculated, the results will be 3 and 4, as illustrated in FIGS. 19(*b*), (*c*).

On the basis of the results of calculation, the hamming distance for which the assumption is "state a reached by traversing path (1)" is shorter than that for which the assumption is "state a reached by traversing path (2)". Accordingly, since the fact that the data was transmitted on path (1) has a high degree of reliability, this path is left as a survivor and the other path is discarded. If this processing for adopting or rejecting paths is executed successively with regard to each of the states a to d starting from time k=1, it is possible to find the paths for which the hamming distances to each of the states a, b, c, d at any time k are shortest (the paths of minimum error). Similar adopt-or-reject processing can continue from this point onward.

When N-items of receive data have been input, the path for which the error is smallest is decided from among the four paths of minimum error leading to respective ones of the states a, b, c, d at k=N and the decoded data is output based upon this path. FIG. 20 illustrates the shortest paths leading to respective ones of the states a to d at each time k when the receive data is 1110001111. The numerical values on the lines are the hamming distances. Accordingly, since the path leading to state c is that for which the error is smallest, the decoded data will be 11001 if decoding is performed in accordance with this path.

This decoding algorithm is referred to as "maximum likelihood decoding", in which the most likely items are selected. It is referred to also as the Viterbi algorithm because it started with Viterbi.

(b) Overview of MAP Decoding

With Viterbi decoding, the paths of large error at discarded at each state and these paths are not at all reflected in the decision regarding paths of minimum error. Unlike Viterbi decoding, MAP decoding is such that even a path of large error at each state is reflected in the decision regarding paths of minimum error, whereby decoded data of higher precision is obtained. The states a to d will be expressed by a state m (=0 to 3) below.

(b-1) First Feature of MAP Decoding

With MAP decoding, the probabilities $\alpha_{0,k}(m)$, $\alpha_{1,k}(m)$ that decoded data $u_K$ is "0", "1" in each state (m=0, 1, 2, 3) at time k are decided based upon ① probabilities $\alpha_{0,k-1}(m)$, $\alpha_{1,k-1}(m)$ in each state at time (k−1), ② the trellis (whether or not a path exists) between states at time (k−1) and time k, and ③ receive data ya, yb at time k. The probabilities $\alpha_{0,k-1}(m)$, $\alpha_{1,k-1}(m)$ are referred to as "forward probabilities". Further, the probability found by taking the trellis ② and receive data ③ into account, namely the probability of a shift from state m' (=0 to 3) at time (k−1) to state m (=0 to 3) at time k is referred to as the "shift probability".

(b-2) Second Feature of MAP Decoding

With Viterbi decoding, the path of minimum error leading to each state at a certain time k is obtained taking into account the receive data from 1 to k and the possible paths from 1 to k. However, the receive data from k to N and the paths from k to N are not at all reflected in the decision regarding paths of minimum error. Unlike Viterbi decoding, MAP decoding is such that receive data from k to N and paths from k to N are reflected in decoding processing to obtain decoded data of higher precision.

More specifically, the probability $\beta_k(m)$ that a path of minimum error will pass through each state m (=0 to 3) at time k is found taking into consideration the receive data and trellises from N to k. Then, by multiplying the probability $\beta_k(m)$ by the forward probabilities $\alpha_{0,k}(m)$, $\alpha_{1,k}(m)$ of the corresponding state, a more precise probability that the decoded data $u_K$ in each state m (m=0, 1, 2, 3) at time k will become "0", "1" is obtained.

To this end, the probability $\beta_k(m)$ in each state m (m=0, 1, 2, 3) at time k is decided based upon ① the probability $\beta_{k+1}(m)$ in each state at time (k+1), ② the trellis between states at time (k+1) and time k, and ③ receive data ya, yb at time (k+1). The probability $\beta_k(m)$ is referred to as "backward probability". Further, the probability found by taking the trellis ② and receive data ③ into account, namely the probability of a shift from state m' (=0 to 3) at time (k+1) to state m (=0 to 3) at time k is the shift probability.

Thus, the MAP decoding method is as follows, as illustrated in FIG. 21:

(1) Letting N represent information length, the forward probabilities $\alpha_{0,k}(m)$, $\alpha_{1,k}(m)$ of each state (m=0 to 3) at time k are calculated taking into consideration the encoded data of 1 to k and trellises of 1 to k. That is, the forward probabilities $\alpha_{0,k}(m)$, $\alpha_{1,k}(m)$ of each state are found from the probabilities $\alpha_{0,k-1}(m)$, $\alpha_{1,k-1}(m)$ and shift probability of each state at time (k−1).

(2) Further, the backward probability $\beta_k(m)$ of each state (m=0 to 3) at time k is calculated using the receive data of N to k and the paths of N to k. That is, the backward probability $\beta_k(m)$ of each state is calculated using the backward probability $\beta_{k+1}(m)$ and shift probability of each state at time (k+1).

(3) Next, the forward probabilities and backward probability of each state at time k are multiplied to obtain the joint probabilities as follows:

$$\lambda_{0,k}(m) = \alpha_{0,k}(m) \cdot \beta_k(m),$$

$$\lambda_{1,k}(m) = \alpha_{1,k}(m) \cdot \beta_k(m)$$

(4) This is followed by finding the sum total $\Sigma_m \lambda_{0,k}(m)$ of the probabilities of "0" and the sum total $\Sigma_m \lambda_{1,k}(m)$ of the probabilities of "1" in each state, calculating the probability that the original data $u_k$ of the kth item of data is "1" and the probability that the data $u_k$ is "0" based upon the magnitudes of the sum totals, outputting the larger probability as the kth item of decoded data and outputting the likelihood. The decoded result is a soft-decision output.

(c) First MAP Decoding Method According to Prior Art (c-1) Overall Structure of MAP Decoder FIG. 22 is a block diagram of a MAP decoder for implementing a first MAP decoding method according to the prior art. Encoding route R, information length N, original information u, encoded data $x_a$, $x_b$ and receive data $y_a$, $y_b$ are as follows:

| |
|---|
| encoding rate: R = ½ |
| information length: N |
| original information: u = {$u_1,u_2,u_3, \ldots ,u_N$} |
| encoded data: $x_a$ = {$x_{a1},x_{a2},x_{a3}, \ldots ,x_{ak}, \ldots ,x_{aN}$} |
| $x_b$ = {$x_{b1},x_{b2},x_{b3}, \ldots ,x_{bk}, \ldots ,x_{bN}$} |
| receive data: $y_a$ = {$y_{a1},y_{a2},y_{a5}, \ldots ,y_{ak}, \ldots ,y_{aN}$} |
| $y_b$ = {$y_{b1},y_{b2},y_{b3}, \ldots ,y_{bk}, \ldots ,y_{aN}$} |

That is, encoded data $x_a$, $x_b$ is generated from the original information u of information length N, an error is inserted into the encoded data at the time of reception, data $y_a$, $y_b$ is received and the original information u is decoded from the receive data.

Upon receiving ($y_{ak}$,$y_{bk}$) at time k, the shift-probability calculation unit 1 calculates the following probabilities and saves them in a memory 2:

probability $\gamma_{0,k}$ that ($x_{ak}$,$x_{bk}$) is (0,0)
probability $\gamma_{1,k}$ that ($x_{ak}$,$x_{bk}$) is (0,1)
probability $\gamma_{2,k}$ that ($x_{ak}$,$x_{bk}$) is (1,0)
probability $\gamma_{3,k}$ that ($x_{ak}$,$x_{bk}$) is (1,1)

Using the forward probability $\alpha_{1,k-1}(m)$ that the original data $u_{k-1}$ is "1" and the forward probability $\alpha_{0,k-1}(m)$ that the original data $u_k$ is "0" in each state m (=0 to 1) at the immediately preceding time (k−1), as well as the obtained shift probabilities $\gamma_{0,k}$, $\gamma_{1,k}$, $\gamma_{2,k}$, $\gamma_{3,k}$ at time k, a forward-probability calculation unit 3 calculates the forward probability $\alpha_{1,k}(m)$ that the original data $u_k$ is "1" and the forward probability $\alpha_{0,k-1}(m)$ that the original data $u_k$ is "0" at time k and stores these probabilities in memories 4a to 4d. It should be noted that since processing always starts from state m=0, the initial values of forward probabilities are $\alpha_{0,0}(0) = \alpha_{1,0}(0) = 1$, $\alpha_{0,0}(m) = \alpha_{1,0}(m) = 0$ (where m≠0).

The shift-probability calculation unit 1 and forward-probability calculation unit 3 repeat the above-described calculations at k=k+1, perform the calculations from k=1 to k=N to calculate the shift probabilities $\gamma_{0,k}$, $\gamma_{1,k}$, $\gamma_{2,k}$, $\gamma_{3,k}$ and forward probabilities $\alpha_{1,k}$, $\alpha_{0,k}$ at each of the times k=1 to N and store these probabilities in memory 2 and memories 4a to 4d, respectively.

Thereafter, a backward-probability calculation unit 5 calculates the backward probability $\beta_k(m)$ (m=0 to 3) in each state m (=0 to 3) at time k using the backward probability $\beta_{k+1}$ and shift probability $\gamma_{s,k+1}$ (s=0, 1, 2, 3) at time (k+1), where it is assumed that the initial value of k is N−1 that the trellis end state is m=0 and that $\beta_N(0)=1$, $\beta_N(1)=\beta_N(2)=\beta_N(3)=0$ hold.

A first arithmetic unit 6a in a joint-probability calculation unit 6 multiplies the forward probability $\alpha_{1,k}(m)$ and backward probability $\beta_k(m)$ in each state m (=0 to 3) at time k to calculate the probability $\lambda_{1,k}(m)$ that the kth item of original data $u_k$ is "1", and a second arithmetic unit 6b in the joint-probability calculation unit 6 uses the forward probability $\alpha_{0,k}(m)$ and backward probability $\beta_k(m)$ in each state m (=0 to 3) at time k to calculate the probability $\lambda_{0,k}(m)$ that the kth item of original data $u_k$ is "0".

A $u_k$ and $u_k$ likelihood calculation unit 7 adds the "1" probabilities $\lambda_{1,k}(m)$ (m=0 to 3) in each of the states m (=0 to 3) at time k, adds the "0" probabilities $\lambda_{0,k}(m)$ (m=0 to 3) in each of the states m (=0 to 3), decides the "1", "0" of the kth item of data $u_k$ based upon the results of addition, namely the magnitudes of $\Sigma_m \lambda_{1,k}(m)$ and $\Sigma_m \lambda_{0,k}(m)$, calculates the confidence (likelihood) $L(u_k)$ thereof and outputs the same.

The backward-probability calculation unit 5, joint-probability calculation unit 6 and $u_k$ and $u_k$ likelihood calculation unit 7 subsequently repeat the foregoing calculations at k=k+1, perform the calculations from k=N to k=1 to decide the "1", "0" of the original data $u_k$ at each of the times k=1 to N, calculate the confidence (likelihood) $L(u_k)$ thereof and output the same.

(c-2) Calculation of Forward Probabilities

The forward probability $\alpha^i_k(m)$ that the decoded data $u_k$ will be i ("0" or "1") is obtained in accordance with the following equation based upon ① forward probability $\alpha^i_{k-1}(m)$ in each state at time (k−1) and ② transition probability $\gamma_i(R_k,m',m)$ of a transition from state m' (=0 to 3) at time (k−1) to state m (=0 to 3) at time k:

$$\alpha^i_k(m) = \Sigma_m \Sigma_j \gamma_i(R_k,m',m) \cdot \alpha^i_{k-1}(m') / \Sigma_m \Sigma_m \Sigma_j \gamma_i(R_k,m',m) \cdot \alpha^i_{k-1}(m') \quad (1)$$

Here the transition probability $\gamma_i(R_k,m',m)$ is found based upon the trellis between state m' (=0 to 3) at time (k−1) and the state m (=0 to 3) at time k as well as the receive data $y_a$, $y_b$ at time k. Since the denominator in the above equation is a portion eliminated by division in the calculation of $u_k$ and likelihood of $u_k$, it need not be calculated. If the forward probabilities $\alpha^0_k(0)$, $\alpha^1_k(0)$ that the original data $u_k$ will be "0", "1" in state m=0 at time k in the above equation are represented diagrammatically, the result will be as shown in FIG. 23.

If it is assumed that a convolutional encoder is constructed by connecting two flip-flops FF1, FF2 and three exclusive-OR gates EXOR1 to EXOR3 in the manner illustrated, the flip-flops FF1, FF2 take on four states m (=0 to 3) of (00), (10), (01), (11). If "0" or "1" is input at each state, the relationship between the input/output data and the states before and after will be as shown in FIG. 25. In FIG. 25, the left side indicates state m' at time k−1, the right side indicates the state m at time k after a kth item of data is input, the solid lines the paths of the state transition when "0" is input and the dashed lines the paths of the state transition when "1" is input, and 00, 11, 10, 01 on the paths indicate the values of the output signals xa, xb. By way of example, if "0" is input in the state m'=1, the output is 01 and the state becomes m=3; if "1" is input, the output is 10 and the state becomes m=2.

The transition probability $\gamma_i(R_k,m',m)$ is the probability of a transition from the state m' (=0 to 3) at time (k−1) when the input data is i ("0" or "1") to the state m (=0 to 3) at time k. This is found in accordance with the following equation:

$$\gamma_i(R_k,m',m)=p \cdot q \cdot \pi \quad (2)$$

where p is a value related to the receive data. However q, π are constant values decided by whether or not there is a transition path (trellis) from state m' at time (k−1) to state m at time k. The result is shown in FIG. 26. If there is no transition path, then $$q \cdot \pi = 0$$

holds. Thus, it will suffice to calculate only p in the transition probabilities $\gamma_0(R_k,0,0)$ and $\gamma_1(R_k,2,0)$ marked by o in FIG. 26; everything else becomes zero. If the lines of transition probabilities of zero in FIG. 23 are eliminated, therefore, the forward probabilities $\alpha^0_k(0)$, $\alpha^1_k(0)$ that $u_k$ is "0", "1" will be as shown in FIG. 27. That is, the forward probabilities are found from the following:

$$\alpha^0_k(0)=\gamma_0(R_k,0,0) \cdot \alpha^0_{k-1}(0)+\gamma_0(R_k,0,0) \cdot \alpha^1_{k-1}(0) \quad (3)$$

$$\alpha^1_k(0)=\gamma_1(R_k,2,0) \cdot \alpha^0_{k-1}(2)+\gamma_1(R_k,2,0) \cdot \alpha^1_{k-1}(2) \quad (4)$$

Transition probabilities are related to the trellises between states and to the receive data. Found from the transition probabilities are ① shift probability $\gamma_{0,k}$ that $(xa_k, xb_k)$ is (0,0) ② shift probability $\gamma_{1,k}$ that $(xa_k, xb_k)$ is (0,1), ( shift probability $\gamma_{2,k}$ that $(xa_k, xb_k)$ is (1,0) and ( shift probability $\gamma_{3,k}$ that $(xa_k, xb_k)$ is (1,1). For example, Equation (3) obtains $\alpha^0_k(0)$ via the transition path of $(xa_k, xb_k)=(0,0)$. We therefore have transition probability $\gamma_0(R_k,0,0)$=shift probability $\gamma_{0,k}$
Further, Equation (4) obtains $\alpha^1_k(0)$ via the transition path of $(xa_k, xb_k)=(0,0)$. We therefore have transition probability $\gamma_1(R_k,2,0)$=shift probability $\gamma_{3,k}$
Accordingly, Equations (3), (4) become as follows:

$$\alpha^0_k(0)=\gamma_{0,k} \cdot \alpha^0_{k-1}(0)+\gamma_{0,k} \cdot \alpha^1_{k-1}(0) \quad (3)'$$

$$\alpha^1_k(0)=\gamma_{3,k} \cdot \alpha^0_{k-1}(2)+\gamma_{3,k} \cdot \alpha^1_{k-1}(2) \quad (4)'$$

Similarly, $\alpha^0_k(m)$, $\alpha^1_k(m)$ of m=1 to 3 are found.

(c-3) Calculation of Backward Probability

The backward probability $\beta_k(m)$ of each state is obtained in accordance with the following equation based upon ① backward probability $\beta_{k+1}(m)$ in each state at time (k+1) and ② transition probability $\gamma_i(R_{k+1},m',m)$ of a transition from state m (=0 to 3) at time k to state m' (=0 to 3) at time (k+1):

$$\beta_k(m)=\Sigma_{m'}\Sigma_i\gamma_i(R_{k+1},m,m') \cdot \beta_{k+1}(m')/\Sigma_m\Sigma_{m'}\Sigma_i\gamma_i(R_k,m,m') \cdot \alpha^i_k(m) \quad (5)$$

Here the transition probability $\gamma_i(R_{k+1},m,m')$ is found based upon the trellis between state m (=0 to 3) at time k and the state m' (=0 to 3) at time (k+1) as well as the receive data $y_a$, $y_b$ at time (k+1). Since the denominator in the above equation is a portion eliminated by division in the calculation of likelihood, it need not be calculated.

If $\beta_k(0)$ in state m=0 at time k in the above equation is represented diagrammatically, the result will be as shown in FIG. 28. If a transition path does not exist, then $q \cdot \pi = 0$ holds, as mentioned above. Accordingly, it will suffice to calculate only p in the transition probabilities $\gamma_0(R_{k+1},0,0)$ and $\gamma_1(R_{k+1},0,1)$ marked; everything else becomes zero. If the lines of the transition probability of zero in FIG. 28 are eliminated, therefore, the backward probability $\beta_k(0)$ will be as shown in FIG. 29. That is, the backward probability is found from the following:

$$\beta_k(0)=\gamma_0(R_{k+1},0,0) \cdot \beta_{k+1}(0)+\gamma_1(R_{k+1},0,1) \cdot \beta_{k+1}(1) \quad (6)$$

Transition probabilities are related to the trellises between states and receive data. Found from the transition probabilities are ① transition probability $\gamma_{0,k+1}$ that $(xa_{k+1}, xb_{k+1})$ is (0,0), ② transition probability $\gamma_{1,k+1}$ that $(xa_{k+1}, xb_{k+1})$ is (0,1), ③ transition probability $\gamma_{2,k+1}$ that $(xa_{k+1}, xb_{k+1})$ is (1,0) and ④ transition probability $\gamma_{3,k+1}$ that $(xa_{k+1}, xb_{k+1})$ is (1,1). For example, the first term on the right side of Equation (6) obtains $\beta_k(0)$ via the transition path of $(xa_{k+1}, xb_{k+1})=(0,0)$. We therefore have transition probability $\gamma_0(R_{k+1},0,0)$=shift probability $\gamma_{0,k+1}$
Further, the second term on the right side of Equation (6) obtains $\beta_k(0)$ via the transition path of $(xa_{k+1}, xb_{k+1})=(1,1)$. We therefore have transition probability $\gamma_1(R_{k+1},0,1)$=shift probability $\gamma_{3,k+1}$
Accordingly, Equation (6) becomes as follows:

$$\beta_k(0)=\gamma_{0,k+1} \cdot \beta_{k+1}(0)+\gamma_{3,k+1} \cdot \beta_{k+1}(1) \quad (6)'$$

Similarly, $\beta_k(1)$, $\beta_k(2)$, $\beta_k(3)$ of m=1 to 3 can be found.

(c-4) Calculation of Joint Probabilities and Likelihood

FIG. 30 is a diagram useful in describing calculation of joint probabilities, $u_k$ and likelihood of $u_k$.

If the forward probabilities $\alpha_{0,k}(m)$, $\alpha_{1,k}(m)$ and backward probability $\beta_k(m)$ of each state at time k are found, these are multiplied to calculate the joint probabilities as follows:

$$\lambda^0_k(m)=\alpha^0_k(m) \cdot \beta_k(m)$$
$$\lambda^1_k(m)=\alpha^1_k(m) \cdot \beta_k(m)$$

The sum total $\Sigma_m \lambda^0_k(m)$ of the probabilities of "0" and the sum total $\Sigma_m \lambda^1_k(m)$ of the probabilities of "1" in each of the states are then obtained and the likelihood is output in accordance with the following equation:

$$L(u)=\log [\Sigma_m \lambda^1_k(m)/\Sigma_m \lambda^0_k(m)] \quad (7)$$

Further, the decoded result $u_k=1$ is output if $L(u)>0$ holds and the decoded result $u_k=0$ is output if $L(u)<0$ holds. That is, the probability that the kth item of original data $u_k$ is "1" and the probability that it is "0" are calculated based upon the magnitudes of the sum total $\Sigma_m \lambda^0_k(m)$ of the probabilities of "0" and of the sum total $\Sigma_m \lambda^1_k(m)$ of the probabilities of "1", and the larger probability is output as the kth item of decoded data.

(c-5) Problem With First MAP Decoding Method

The problem with the first MAP decoding method of the prior art shown in FIG. 22 is that the memory used is very large. Specifically, the first MAP decoding method requires a memory of 4×N for storing transition probabilities and a memory of m (number of states)×2×N for storing forward probabilities, for a total memory of (4+m×2)×N. Since actual calculation is accompanied by soft-decision signals, additional memory which is eight times this figure is required. For example, if signal length N=5120 bits holds, number of states m=4 holds in case of constraint length=3 and number of soft-decision quantization bits=8 holds, then the required amount of memory is (4+4×2)×5120×8=491.52 kilobits (c-6) Modification The memory 2 for storing shift probabilities is not necessarily required, and an arrangement can be adopted in which the backward probability $\beta_k(m)$ is calculated by calculating the shift probability $\gamma_{s,k+1}$ (s=0, 1, 2, 3) as necessary. FIG. 31 is a modification of a MAP decoder for implementing the first MAP decoding method from which memory 2 has been removed. According to this modification, the amount of memory required is (4×2)×5120×8=327.7 kilobits (d) Second MAP Decoding Method According to Prior Art Accordingly, in order to reduce memory, a method considered is to perform the calculations upon switching the order in which the forward probability and backward probability are calculated. FIG. 32 is a block diagram of a MAP decoder for implementing this second MAP decoding method. Components identical with those shown in FIG. 22 are designated by like reference characters. An input/output reverser 8, which suitably reverses the order in which receive data is output, has a memory for storing all receive data and a data output unit for outputting the receive data in an order that is the reverse of or the same as that in which the data was input. With a turbo decoder that adopts the MAP decoding method as its decoding method, it is necessary to interleave the receive data and therefore the decoder has a memory for storing all receive data. This means that this memory for interleaving can also be used as the memory of the input/output reverser 8. Hence there is no burden associated with memory.

The shift-probability calculation unit 1 uses receive data $(y_{ak}, y_{bk})$ at time k (=N), calculates the following probabilities and saves them in the memory 2:

probability $\gamma_{0,k}$ that $(x_{ak}, x_{bk})$ is (0,0)
probability $\gamma_{1,k}$ that $(x_{ak}, x_{bk})$ is (0,1)
probability $\gamma_{2,k}$ that $(x_{ak}, x_{bk})$ is (1,0)
probability $\gamma_{3,k}$ that $(x_{ak}, x_{bk})$ is (1,1)

The backward-probability calculation unit 5 calculates the backward probability $\beta_{k-1}(m)$ (m=0 to 3) in each state m (=0 to 3) at time k−1 using the backward probability $\beta_k(m)$ and shift probability $\gamma_{s,k}$ (s=0, 1, 2, 3) at time k (=N) and stores the backward probabilities in memory 9.

The shift-probability calculation unit 1 and forward-probability calculation unit 3 subsequently repeat the above-described calculations at k=k+1, perform the calculations from k=N to k=1 to calculate the shift probabilities $\gamma_{0,k}$, $\gamma_{1,k}$, $\gamma_{2,k}$, $\gamma_{3,k}$ and backward probability $\beta_k(m)$ at each of the times k=1 to N and store these probabilities in memories 2, 9.

Thereafter, using the forward probability $\alpha_{1,k-1}(m)$ that the original data $u_{k-1}$ is "1" and the forward probability $\alpha_{0,k-1}(m)$ that the original data $u_{k-1}$ is "0" at time (k−1), as well as the obtained shift probabilities $\gamma_{0,k}$, $\gamma_{1,k}$, $\gamma_{2,k}$, $\gamma_{3,k}$ at time k, the forward-probability calculation unit 3 calculates the forward probability $\alpha_{1,k}(m)$ that $u_k$ is "1" and the forward probability $\alpha_{0,k}(m)$ that $u_k$ is "0" in each state m (=0 to 3) at time k. It should be noted that the initial value of k is 1.

The joint-probability calculation unit 6 multiplies the forward probability $\alpha_{1,k}(m)$ and backward probability $\beta_k(m)$ in each state m 0 to 3 at time k to calculate the probability $\lambda_{1,k}(m)$ that the kth item of original data $u_k$ is "1", and similarly uses the forward probability $\alpha_{0,k}(m)$ and backward probability $\beta_k(m)$ in each state 0 to 3 at time k to calculate the probability $\lambda_{0,k}(m)$ that the original data $u_k$ is "0".

The $u_k$ and $u_k$ likelihood calculation unit 7 adds the "1" probabilities $\lambda_{1,k}(m)$ (m=0 to 3) of each of the states 0 to 3 at time k, adds the "0" probabilities $\lambda_{0,k}(m)$ (m=0 to 3) of each of the states 0 to 3 at time k, decides the "1", "0" of the kth item of data $u_k$ based upon the results of addition, namely the magnitudes of $\Sigma_m \alpha_{1,k}(m)$ and $\Sigma_m \alpha_{0,k}(m)$, calculates the confidence (likelihood) $L(u_k)$ thereof and outputs the same.

The forward-probability calculation unit 3, joint-probability calculation unit 6 and $u_k$ and $u_k$ likelihood calculation unit 7 subsequently repeat the foregoing calculations at k=k+1, perform the calculations from k=1 to k=N to decide the "1", "0" of $u_k$ at each of the times k=1 to N, calculate the confidence (likelihood) $L(u_k)$ thereof and output the same.

In accordance with the second MAP decoding method, as shown in the time chart of FIG. 33, the processing for calculation of shift probability, for calculation of backward probability and for storing the results of calculation in memory is executed in the first half, and the processing for calculation forward probability, for calculation of joint probability and for computation of original data and likelihood is executed in the second half. In other words, with the second MAP decoding method, forward probabilities $\alpha_{1,k}(m)$, $\alpha_{0,k}(m)$ are not stored but the backward probability $\beta_k(m)$ is stored. As a result, memory required for the second MAP decoding method is just 4×N for storing shift probability and number of states m×N for storing backward probability, so that the total amount of memory required is (4+m)×N. Thus the amount of memory required can be reduced in comparison with the first MAP decoding method. The reduction ratio $\eta$ is $$\eta = (4+m)/(4+m \times 2)$$

In a case where the number m of states is small (number of states m=4 holds if constraint length=3 holds), the reduction ratio is $$\eta = (4+4)/(4+4 \times 2) = 69.2\%$$

so that memory can be reduced by about 30%. Further, if the number m of states is large, we have $$\eta \approx m/(m \times 2) = 50\%$$

The memory 2 for storing shift probabilities is not necessarily required, and an arrangement can be adopted in which the forward probabilities $\alpha_{1,k}(m)$, $\alpha_{0,k}(m)$ are calculated by calculating the shift probability $\gamma_{s,k}$ (s=0, 1, 2, 3) on each occasion. FIG. 34 shows a modification of a MAP decoder for implementing the second MAP decoding method from which the memory 2 has been removed. According to this modification, the total memory required is (m×N). Thus the amount of memory required can be reduced in comparison with the modification of the first MAP decoding method shown in FIG. 31. The reduction ratio $\eta$ is $$\eta = m \times N/(m \times 2) \times N = 50\%$$

(e) Third MAP Decoding Method

In accordance with the second MAP decoding method, memory used can be reduced in comparison with the first MAP decoding method. However, there is still room for a further reduction.

FIG. 35(a) is a diagram useful in describing the operation sequence of the third MAP decoding method, which makes possible a further reduction in memory used. This represents a further expansion of the second MAP decoding method. In FIG. 35, the operation sequence of the second MAP decoding method is indicated at (b) for the purpose of contrasting the second and third MAP decoding methods. The third MAP decoding method is a method disclosed in IEEE JOURNAL ON SELECTED AREAS IN COMMUNICATION, VOL. 16, NO. 2, FEBRUARY 1998, "An Intuitive Justification and a Simplified Implementation of the MAP Decoder for Convolutional Codes", Andrew J. Viterbi.

In FIG. 35, the B operation signifies backward probability calculation/shift probability calculation, the A operation signifies forward probability calculation/shift probability calculation, and the L operation signifies joint probability calculation/likelihood calculation. With the second MAP decoding method, as indicated at (b), (1) the B operation is performed in its entirety and the results are stored in memory from N to 1, then (2) $u_k$ and likelihood ($u_k$) are output while performing the A operation and the L operation successively from 1 to N. According to the second MAP decoding method, however, N×m of memory is required in order to store the backward probability $\beta_k(m)$.

Accordingly, in the third MAP decoding method, k=1 to N is divided equally into segments M and MAP decoding is executed as set forth below.

First, (1) the B operation is performed from k=2M to k=0. In the B operation, the backward probability $\beta_k(m)$ is not calculated from k=N; calculation starts from an intermediate position k=2M. As a consequence, the backward probability $\beta_k(m)$ found over k=2M to k=M in the first half cannot be trusted and is discarded. The backward probability $\beta_k(m)$ found over k=M to k=1 in the second half can be trusted and therefore this is stored in memory. (2) Next, the A operation is performed at k=0, the L operation is performed using the results $\alpha_{1,1}(m)$, $\alpha_{0,1}(m)$ of the A operation at k=1 and $\beta_1(m)$ that has been stored in memory, and the decoded result $u_1$ and likelihood L ($u_1$) are calculated based upon the joint probabilities. Thereafter, and in similar fashion, the A operation is performed from k=2 to k=M and the L operation is performed based upon the results of the A operation and the results of the B operation in memory. This ends the calculation of the decoded result $u_k$ and likelihood L ($u_k$) from k=1 to k=M.

Next, (3) the B operation is performed from k=3M to M+1. In the B operation, the backward probability $\beta_k(m)$ is not calculated from k=N; calculation starts from an intermediate position k=3M. As a consequence, the backward probability $\beta_k(m)$ found over k=3M to k=2M+1 in the first half cannot be trusted and is discarded. The backward probability $\beta_k(m)$ found over k=2M to k=M+1 in the second half can be trusted and therefore this is stored in memory. (4) Next, the A operation is performed at k=M+1, the L operation is performed using the results $\alpha_{1,M+1}(m)$, $\alpha_{0,M+1}(m)$ of the A operation at k=M+1 and $\beta_{M+1}(m)$ that has been stored in memory, and the decoded result $u_{M+1}$ and likelihood L ($u_{M+i}$) are calculated based upon the joint probabilities. Thereafter, and in similar fashion, the A operation is performed from k=M+2 to k=2M and the L operation is performed based upon the results of the A operation and the results of the B operation in memory. This ends the calculation of the decoded result $u_k$ and likelihood L ($u_k$) from k=M+1 to k=2M.

Next, in similar fashion, (5) the B operation is performed from k=4M to 2M+1 and the backward probability $\beta_k(m)$ found over k=3M to k=2M+1 of the second half is stored in memory. (6) Next, the A operation is performed at k=2M+1, the L operation is performed using the results $\alpha_{1,2M+1}(m)$, $\alpha_{0,2M+1}(m)$ of the A operation at k=2M+1 and $\beta_{2M+1}(m)$ that has been stored in memory, and the decoded result $u_{2M+1}$ and likelihood L ($u_{2M+i}$) are calculated based upon the joint probabilities. Thereafter, the A operation is performed from k=2M+2 to k=3M and the L operation is performed based upon the results of the A operation and the results of the B operation in memory. This ends the calculation of the decoded result $u_k$ and likelihood L ($u_k$) from k=2M+1 to k=3M.

This is followed by performing similar operations. Finally, (7) the B operation is performed from k=N (=5M) to k=3M+1 and all backward probabilities $\beta_k(m)$ found are stored in memory. (8) Next, the A operation is performed at k=3M+1, the L operation is performed using the results $\alpha_{1,3M+1}(m)$, $\alpha_{0,3M+1}(m)$ of the A operation at k=3M+1 and $\beta_{3M+1}(m)$ that has been stored in memory, and the decoded result $u_3M+1$ and likelihood L ($u_{3M+i}$) are calculated based upon the joint probabilities. Thereafter, the A operation is performed from k=3M+2 to k=N (=5M) and the L operation is performed based upon the results of the A operation and the results of the B operation in memory. This ends the calculation of the decoded result $u_k$ and likelihood L ($u_k$) from k=3M+1 to k=N.

The third MAP decoding method is advantageous in that the memory for storage of the backward probabilities can be reduced to 2M. Moreover, the time needed to output the initial decoded result $u_1$ and likelihood L ($u_1$) can be curtailed.

With the third MAP decoding method, however, the backward probability $\beta_k(m)$ is not calculated from k=N but is calculated from an intermediate point. As a consequence, the backward probability $\beta_k(m)$ is not accurate and a problem that arises is a decline in the precision of MAP decoding.

Further, with the third MAP decoding method, the A calculation over M is performed after the B calculation over 2M, and therefore the result in the form of a time chart is as shown in FIG. 36(a). However, since this method renders the A operation intermittent, calculation takes time. Accordingly, by performing the first and second halves of the B operation simultaneously, as illustrated in FIG. 36(b), the A operation can be executed continuously, thereby raising operation speed. However, the problem with this method is that two B arithmetic circuits are required because the first and second halves of the B operation are executed simultaneously.

A further problem with the third MAP decoding method is that the calculation of the backward probability $\beta_k(m)$ is repeated, i.e., performed twice, so that there is an overall increase in power consumption.

Accordingly, an object of the present invention is to cut down on memory and calculate backward probability $\beta_k(m)$ accurately to raise the precision of MAP decoding.

Another object of the present invention is to arrange it so that a prescribed operation speed can be obtained without using two arithmetic circuits to calculate backward probability $\beta_k(m)$.

Another object of the present invention is to make it possible to calculate backward probability $\beta_k(m)$ accurately by calculating backward probability $\beta_k(m)$ just one time, thereby providing an advantage in terms of power consumption.

DISCLOSURE OF THE INVENTION

In a first MAP decoding method, (1) backward probabilities are calculated in a reverse direction from an Nth backward probability to a first backward probability, an $m_1$th backward probability to the first backward probability are saved, then first forward probability is calculated, a first decoded result is obtained using the first forward probability and the saved first backward probability, and second to $m_1$th decoded results are obtained in similar fashion. (2) Thereafter, backward probabilities are calculated in the reverse direction from the Nth backward probability to an $(m_1+1)$th backward probability, an $m_2$th backward probability to the $(m_1+1)$th backward probability are saved, $(m_1+1)$th forward probability is calculated, an $(m_1+1)$th decoded result is obtained using the $(m_1+1)$th forward probability and the saved $(m_1+1)$th backward probability, $(m_1+2)$th to $m_2$th decoded results are obtained in similar fashion and (3) $(m_2+1)$th to Nth decoded results are subsequently obtained in similar fashion.

If this arrangement is adopted, a memory capacity of just r×m (number of states) is required to store the backward probabilities, where $m_1=r$, $m_2=2r$, ... holds. Moreover, since the backward probabilities are calculated from k=N at all times, backward probability $\beta_k(m)$ is calculated accurately to make it possible to raise the precision of MAP decoding.

In another MAP decoding method, (1) backward probabilities are calculated in a reverse direction from an Nth backward probability to a first backward probability, an $m_s$th backward probability, $m_{(s-1)}$th backward probability, ..., $m_2$th backward probability are saved discretely, an $m_1$th backward probability to the first backward probability are saved continuously, first forward probability is calculated, a first decoded result is obtained using the first forward probability and the saved first backward probability, and second to $m_1$th decoded results are obtained in similar fashion. (2) Thereafter, backward probabilities up to an $(m_1+1)$th backward probability are calculated and saved starting from the saved $m_2$th backward probability, $(m_1+1)$th forward probability is calculated, an $(m_1+1)$th decoded result is obtained using the $(m_1+1)$th forward probability and the saved $(m_1+1)$th backward probability, $(m_1+2)$th to $m_2$th decoded results are obtained in similar fashion and (3) $(m_2+1)$th to Nth decoded results are subsequently obtained in similar fashion.

If this arrangement is adopted, a memory capacity of just r×m (number of states) is required to store the backward probabilities, where $m_1=r$, $m_2=2r$, ... holds. Further, it is so arranged that backward probabilities are calculated in a reverse direction from an Nth backward probability to a first backward probability, the obtained backward probabilities are stored discretely and, if necessary, backward probabilities of the required number are calculated and utilized starting from one of the discretely stored backward probabilities. As a result, backward probability $\beta_k(m)$ can be calculated accurately to make it possible to raise the precision of MAP decoding. Moreover, backward probabilities of the required number need not be obtained by calculating backward probabilities from k=N on as the occasion demands. Operation speed can be raised as a result. Further, a prescribed operation speed is obtained without using two arithmetic circuits to calculate backward probability $\beta_k(m)$. Furthermore, backward probability $\beta_k(m)$ need be calculated just one time, thereby providing an advantage in terms of power consumption.

BRIEF DESCRIPTION OF THE DRAWINGS

FIG. 11 is a block diagram of a convolutional encoder;
FIG. 12 is a diagram useful in describing the relationship between inputs and outputs of a convolutional encoder;
FIG. 13 is a diagram useful in describing the states of a convolutional encoder;
FIG. 15 is a diagram useful in describing a lattice-like representation;
FIG. 24 is a block diagram of a convolutional encoder;
FIG. 25 is a diagram showing the relationship between the states and input/output of a convolutional encoder;
FIG. 26 is a diagram useful in describing transition probabilities.

FIG. 35 is a diagram useful in describing the operation sequence of a third MAP decoding method according to the prior art.

BEST MODE FOR CARRYING OUT THE INVENTION (A) Turbo Codes

Figure 1:
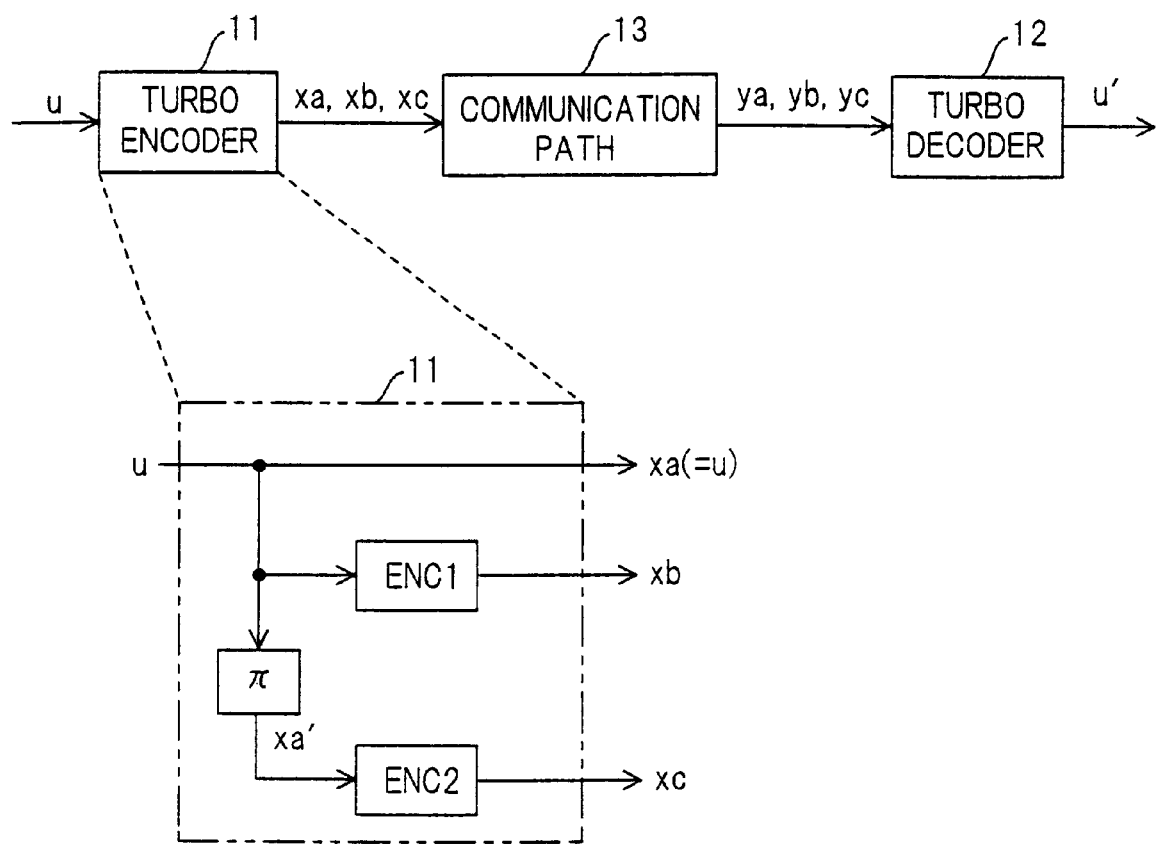
FIG. 1 is a schematic view of a communication system.

The MAP decoding method manifests its effectiveness in turbo codes. FIG. 1 is a block diagram of a communication system that includes a turbo encoder and a turbo decoder. Numeral 11 denotes the turbo encoder, which is provided on the data transmitting side, and numeral 12 denotes the turbo decoder, which is provided on the data receiving side. Numeral 13 denotes a data communication path. Further, character u represents transmit information data of length N; xa, xb, xc represent encoded data obtained by encoding the information data u by the turbo encoder 11; ya, yb, yc denote receive signals that have been influenced by noise and fading as a result of propagation of the encoded data xa, xb, xc through the communication path 13; and u' represents results of decoding obtained by decoding the receive data ya, yb, yc by the turbo decoder 12. These items of data are as expressed below.

Original data: $u = \{u1, u2, u3, \ldots, u_N\}$
Encoded data: $xa = \{x_{a1}, x_{a2}, x_{a3}, \ldots, x_{ak}, \ldots, x_{aN}\}$
$xb = \{x_{b1}, x_{b2}, x_{b3}, \ldots, x_{bk}, \ldots, x_{bN}\}$
$xc = \{x_{c1}, x_{c2}, x_{c3}, \ldots, x_{ck}, \ldots, x_{cN}\}$
Receive data: $ya = \{y_{a1}, y_{a2}, y_{a3}, \ldots, y_{ak}, \ldots, y_{aN}\}$
$yb = \{y_{b1}, y_{b2}, y_{b3}, \ldots, y_{bk}, \ldots, y_{bN}\}$
$yc = \{y_{c1}, y_{c2}, y_{c3}, \ldots, y_{ck}, \ldots, y_{cN}\}$ The turbo encoder 11 encodes the information data u of information length N and outputs the encoded data xa, xb, xc. The encoded data xa is the information data u per se, the encoded data xb is data obtained by the convolutional encoding of the information data u by an encoder ENC1, and the encoded data xc is data obtained by the interleaving ($\pi$) and convolutional encoding of the information data u by an encoder ENC2. In other words, a turbo code is obtained by combining two convolutional codes. It should be noted that an interleaved output xa' differs from the encoded data xa only in terms of its sequence and therefore is not output.

Figure 2:
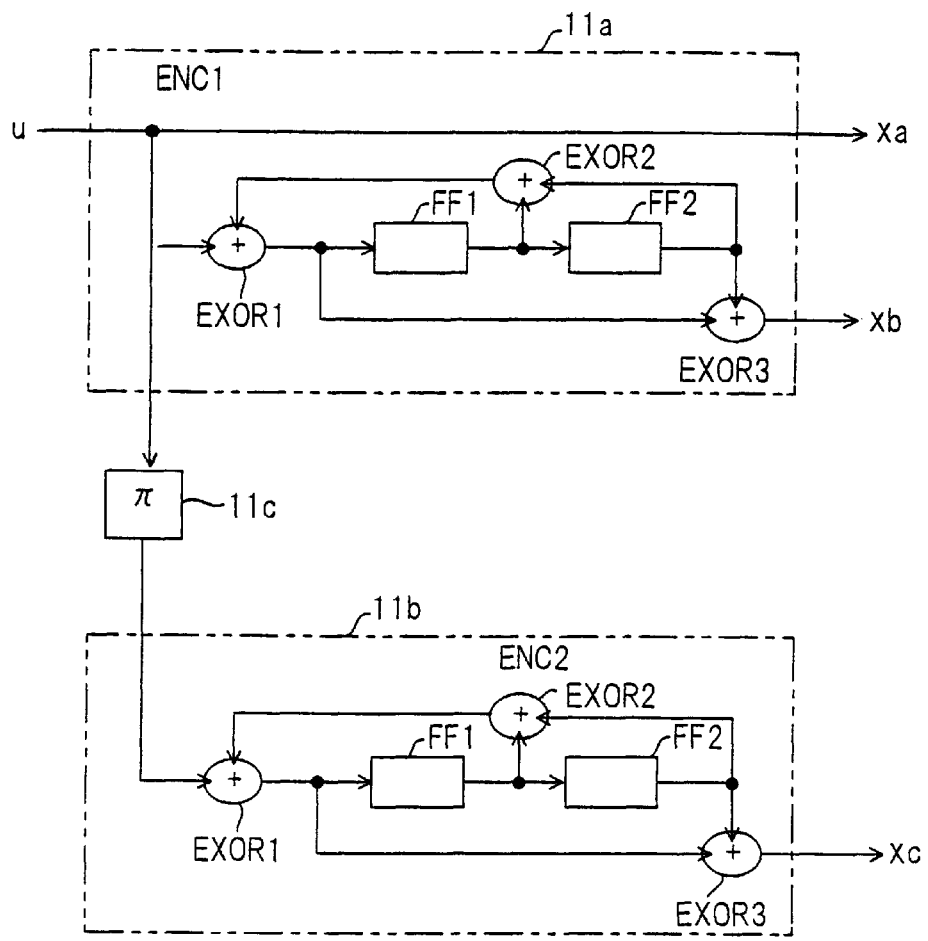
FIG. 2 is a block diagram of a turbo encoder.
Figure 3:
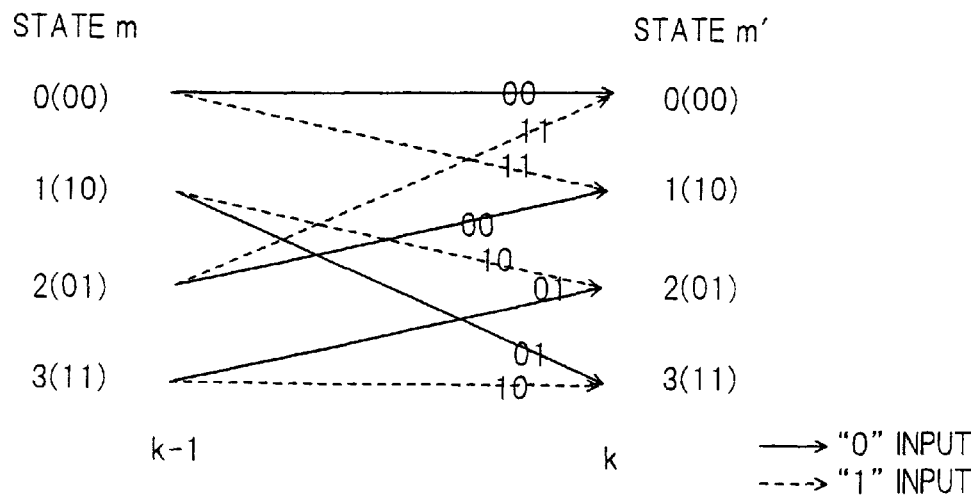
FIG. 3 is a diagram showing transitions in the state of a convolutional encoder.

FIG. 2 is a diagram showing the details of the turbo encoder 11. Numerals 11a, 11b denote convolutional encoders (ENC1, ENC2) that are identically constructed, and numeral 11c denotes an interleaving unit ($\pi$). The convolutional encoders 11a, 11b, which are adapted to output recursive systematic convolutional codes, are each constructed by connecting two flip-flops FF1, FF2 and three exclusive-OR gates EXOR1~EXOR3 in the manner illustrated. The flip-flops FF1, FF2 take on four states 0(=00), 1(=10), 2(=01), 3(=11). If 0 or 1 is input in each of these states, the states undergo a transition as illustrated in FIG. 3 and the flip-flops output xa, xb. In FIG. 3, the left side indicates the state prior to input of receive data, the right side the state after the input, the solid lines the path of the state transition when "0" is input and the dashed lines the path of the state transition when "1" is input, and 00, 11, 10, 01 on the paths indicate the values of the output signals xa, xb. By way of example, if "0" is input in the state 0(=00), the output is 00 and the state becomes 0(=00); if "1" is input, the output is 11 and the state becomes 1(=10).

Figure 4:
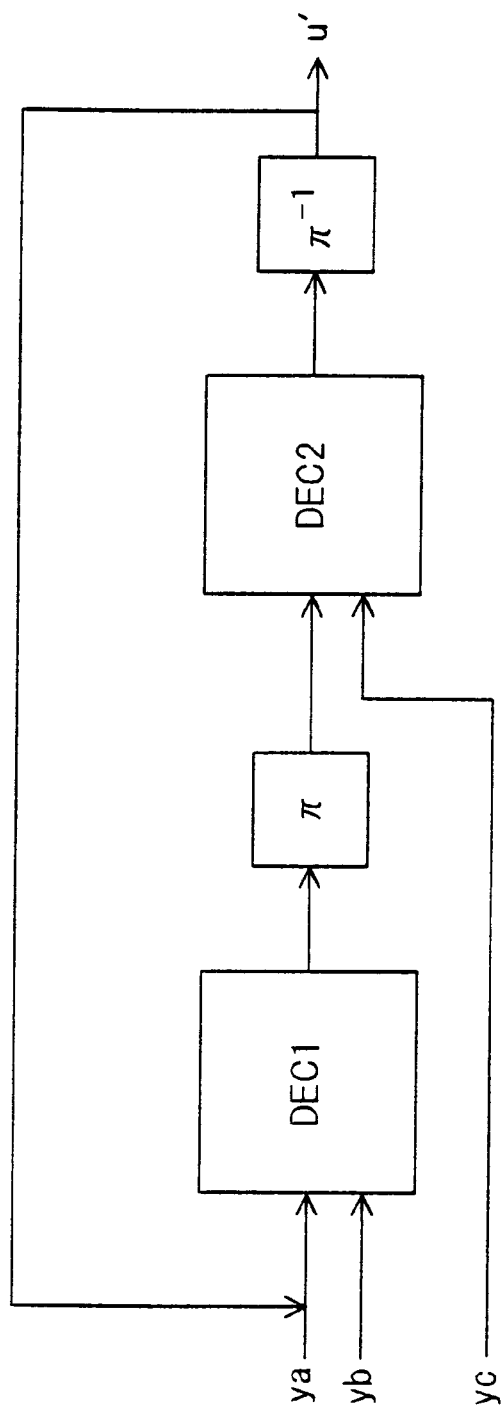
FIG. 4 is a block diagram of a turbo decoder.

FIG. 4 is a block diagram of the turbo decoder. Turbo decoding is performed by a first element decoder DEC1 using ya and yb first among the receive signals ya, yb, yc. The element decoder DEC1 is a soft-output element decoder and outputs the likelihood of decoded results. Next, similar decoding is performed by a second element decoder DEC2 using the likelihood, which is output from the first element decoder DEC1, and yc. That is, the second element decoder DEC2 also is a soft-output element decoder and outputs the likelihood of decoded results. Here yc is a receive signal corresponding to xc, which was obtained by interleaving and encoding the information data u. Accordingly, the likelihood that is output from the first element decoder DEC1 is interleaved ($\pi$) before it enters the second element decoder DEC2.

The likelihood output from the second element decoder DEC2 is deinterleaved ($\pi^{-1}$) and then is fed back as the input to the first element decoder DEC1. Further, u' is decoded data (results of decoding) obtained by rendering a "0", "1" decision regarding the interleaved results from the second element decoder DEC2. Error rate is reduced by repeating the above-described decoding operation a prescribed number of times.

MAP element decoders can be used as the first and second element decoders DEC1, DEC2 in such a turbo element decoder.

(B) First Embodiment (a) Operation Sequence

Figure 5:
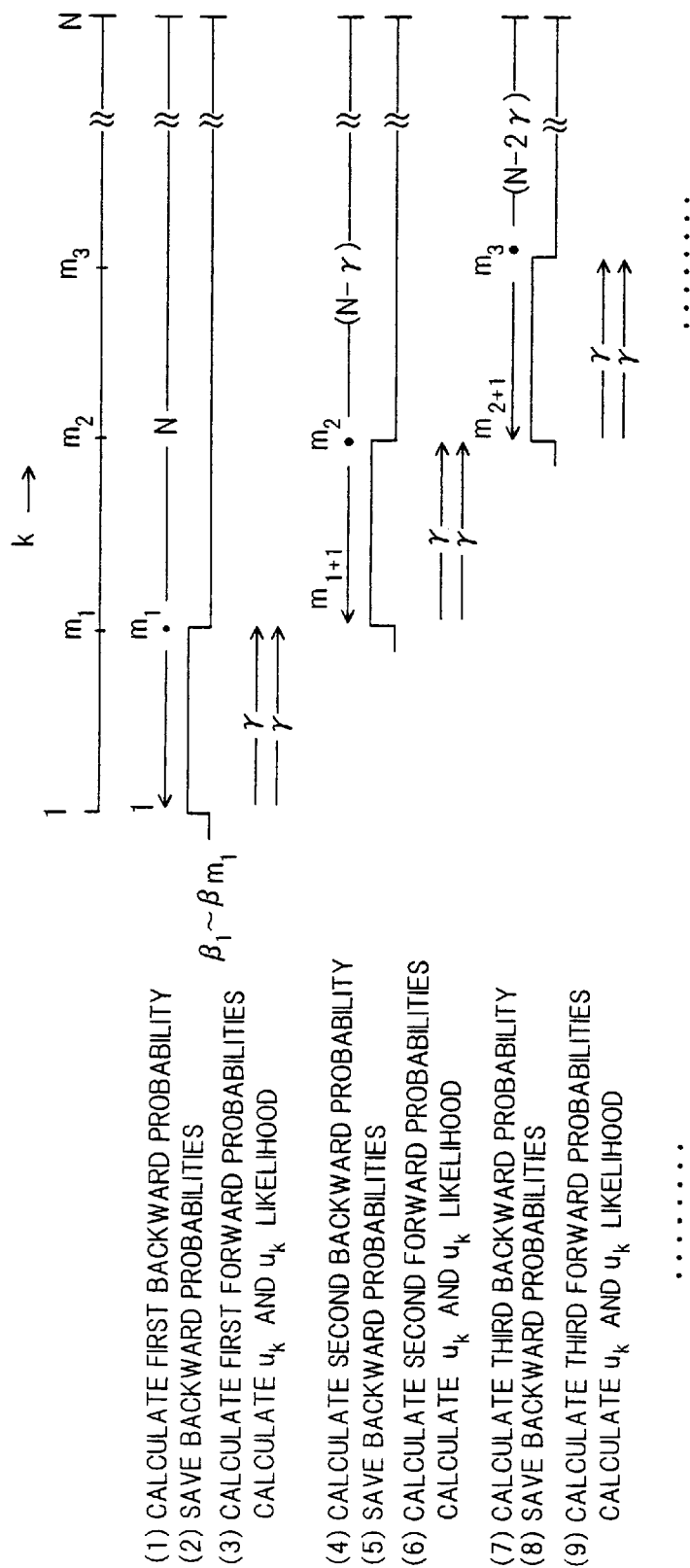
FIG. 5 is a diagram useful in describing the operation sequence of a first MAP decoding method according to the present invention.

FIG. 5 is a diagram useful in describing the operation sequence of a first MAP decoding method according to the present invention.

(1) At the beginning, all backward probabilities $\beta_k(m)$ (k=N to 1) are calculated in the reverse direction up to a first backward probability at k=1 starting from an Nth backward probability at k=N, and (2) an $m_1$th backward probability $\beta_{m1}(m)$ to a first backward probability $\beta_1(m)$ are saved. Next, (3) first forward probabilities $\alpha^1_1(m)$, $\alpha^0_1(m)$ are calculated, first decoded data $u_i$ and likelihood $L(u_i)$ are obtained using the first forward probabilities and the saved first backward probability $\beta_1(m)$, and second to $m_1$th decoded data $u_2$ to $u_{m1}$ and likelihoods $L(u_2)$ to $L(u_{m1})$ are obtained in similar fashion.

(4) Thereafter, backward probabilities are calculated in the reverse direction from the Nth backward probability to an ($m_1+1$)th backward probability, and (5) an $m_1$th backward probability $\beta_{m2}(m)$ to the ($m_1+1$)th backward probability $\beta_{m1+1}(m)$ are saved. Next, (6) ($m_1+1$)th forward probabilities $\alpha^1_{m1+1}(m)$, $\alpha^0_{m1+1}(m)$ are calculated, ($m_1+1$)th decoded data $u_{m1+1}$ and likelihood $L(u_{m1+1})$ are obtained using the ($m_1+1$)th forward probabilities and the saved ($m_1+1$)th backward probability $\beta_{m1+1}(m)$, and ($m_1+2$)th to $m_2$th decoded data $u_{m1+2}$ to $u_{m2}$ and likelihoods $L(u_{m1+2})$ to $L(u_{m2})$ are obtained in similar fashion. (7) Thereafter, ($m_2+1$)th to Nth decoded data $u_{m2+1}$ to $u_N$ and likelihoods $L(u_{m2+1})$ to $L(u_N)$ are obtained in similar fashion.

(b) MAP Decoder of First Embodiment

Figure 6:
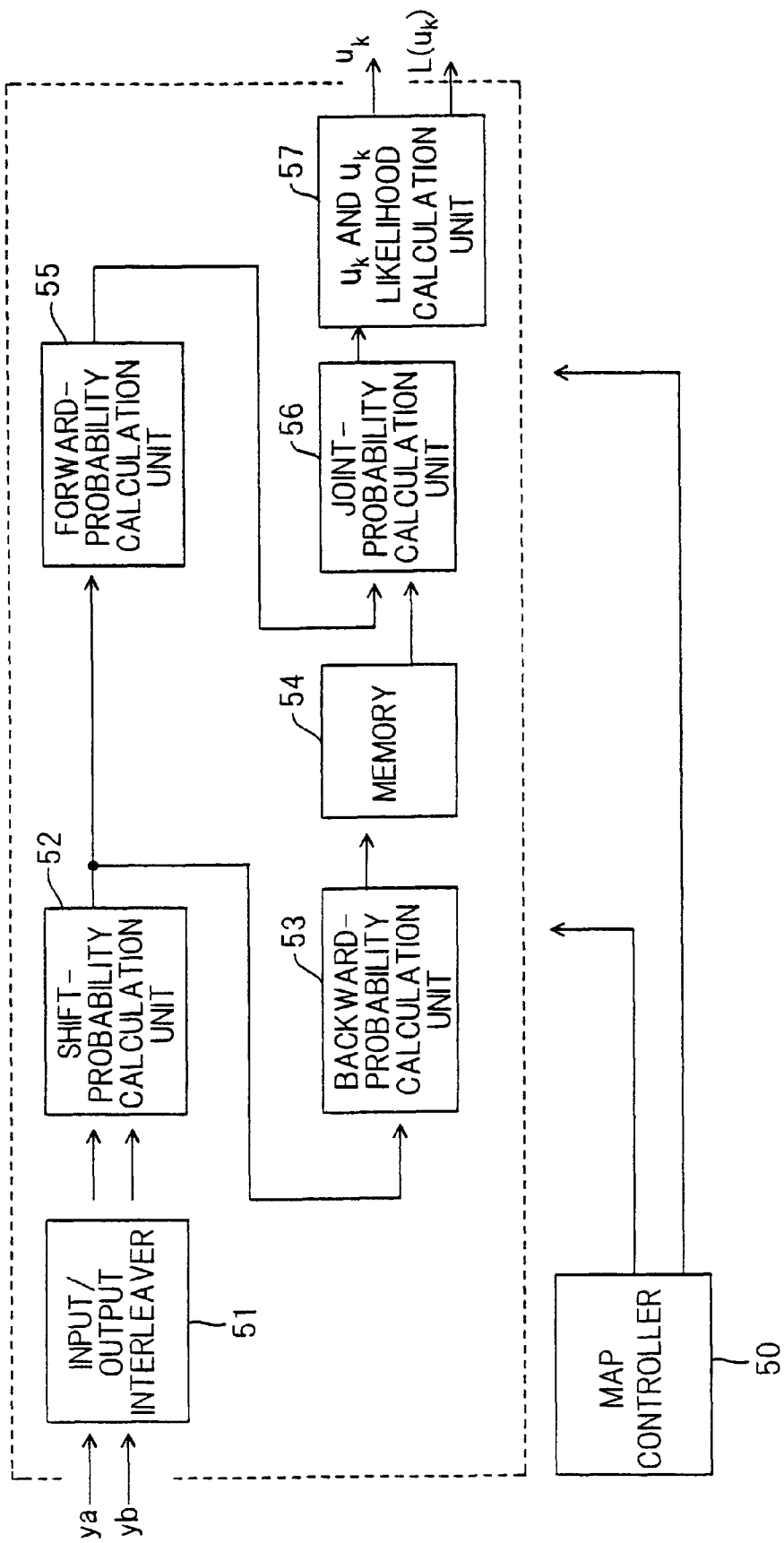
FIG. 6 is a block diagram of a MAP decoder according to a first embodiment.

FIG. 6 is a block diagram of a MAP decoder according to the first embodiment.

A MAP controller 50 controls the overall MAP decoder, i.e., controls the calculation timing of each component and the read-out and writing of data from and to memory, etc., in accordance with the operation sequence of FIG. 5. An input/output interleaver 51, which is for changing the output sequence of receive data as appropriate, has a memory for storing all receive data and a data output unit for outputting the receive data in an order that is the reverse of or the same as that in which the data was input. With a turbo decoder, it is necessary to interleave the receive data and therefore the decoder has a memory for storing all receive data. This means that this memory for interleaving can also be used as the memory of the input/output interleaver 51. Hence there is no burden associated with memory.

A shift-probability calculation unit 52 uses receive data ($y_{ak}, y_{bk}$) at time k (=N) to calculate the following:
probability $\gamma_{0,k}$ that ($x_{ak}, x_{bk}$) is (0,0)
probability $\gamma_{1,k}$ that ($x_{ak}, x_{bk}$) is (0,1)
probability $\gamma_{2,k}$ that ($x_{ak}, x_{bk}$) is (1,0)
probability $\gamma_{3,k}$ that ($x_{ak}, x_{bk}$) is (1,1)
Further, a backward-probability calculation unit 53 calculates the backward probability $\beta_{k-1}(m)$ (m=0 to 3) in each state m (=0 to 3) at time k−1 using the backward probability $\beta_k(m)$ and shift probability $\gamma_{s,k}$ (s=0, 1, 2, 3) at time k (=N). Thereafter, the shift-probability calculation unit 52 and backward-probability calculation unit 53 repeat the above-described calculations at k=k−1, perform the calculations from k=N to k=1 and save the $m_1$th backward probability $\beta_{m1}(m)$ to the first backward probability $\beta_1(m)$ from k=$m_1$ to 1 in a memory 54.

Thereafter, the shift-probability calculation unit 52 uses receive data ($y_{ak}, y_{bk}$) at time k (=1) to calculate the following:
probability $\gamma_{0,k}$ that ($x_{ak}, x_{bk}$) is (0,0)
probability $\gamma_{1,k}$ that ($x_{ak}, x_{bk}$) is (0,1)
probability $\gamma_{2,k}$ that ($x_{ak}, x_{bk}$) is (1,0)
probability $\gamma_{3,k}$ that ($x_{ak}, x_{bk}$) is (1,1)
Further, the forward-probability calculation unit 55 assumes k=1 and calculates the forward probabilities $\alpha^1_k(m)$, $\alpha^0_k(m)$ in each state m (=0 to 3) at time k using the forward probabilities $\alpha^1_{k-1}(m)$, $\alpha^0_{k-1}(m)$ at time (k−1) and the obtained shift probabilities $\gamma_{0,k}, \gamma_{1,k}, \gamma_{2,k}, \gamma_{3,k}$ at time k.

A joint-probability calculation unit 56 multiplies the forward probability $\alpha^1_k(m)$ and backward probability $\beta_k(m)$ in each state m (=0 to 3) at time k to calculate the probability $\lambda^1_k(m)$ that the kth item of original data $u_k$ is "1", and similarly calculates the probability $\lambda^0_k(m)$ that the original data $u_k$ is "0" using the forward probability $\alpha^0_k(m)$ and backward probability $\beta_k(m)$ in each state m (=0 to 3) at time k.

A $u_k$ and $u_k$ likelihood calculation unit 57 obtains the sum total $\Sigma_m \lambda^0_k(m)$ of the probabilities of "0" and the sum total $\Sigma_m \lambda^1_k(m)$ of the probabilities of "1" in each state m (=0 to 3) at time k and outputs the likelihood in accordance with the following equation:

L(u)=log [$\Sigma_m \lambda^1_k(m)/\Sigma_m \lambda^0_k(m)$]

Further, the decoded result $u_k$=1 is output if L(u)>0 holds and the decoded result $u_k$=0 is output if L(u)<0 holds.

Thereafter, the shift-probability calculation unit 52, a forward-probability calculation unit 55, the joint-probability calculation unit 56 and the $u_k$ and $u_k$ likelihood calculation unit 57 repeat the foregoing calculations at k=k+1, perform the calculations from k=1 to k=$m_1$, calculate $u_k$ and the confidence (likelihood) L($u_k$) thereof at each time from k=1 to $m_1$ and output the same.

If the calculation of $u_k$ and L($u_k$) from k=1 to k=$m_1$ is completed, then, under the control of the MAP controller 50, the shift-probability calculation unit 52 calculates the probabilities $\gamma$hd 0,k, $\gamma_{1,k}, \gamma_{2,k}, \gamma_{3,k}$ using the receive data ($y_{ak}, y_{bk}$) at time k (=N). Further, the backward-probability calculation unit 53 calculates the backward probability $\beta_{k-1}(m)$ (m=0 to 3) in each state m (=0 to 3) at time k−1 using the backward probability $\beta_k(m)$ and shift probability $\gamma_{s,k}$ (s=0 1, 2, 3) at time k=(N).

The shift-probability calculation unit 52 and backward-probability calculation unit 53 subsequently repeat the above calculations at k=k−1, perform calculations from k=N to k=$m_1$+1 and save the $m_2$th backward probability $\beta_{m2}(m)$ to the ($m_1$+1)th backward probability $\beta_{m1+1}(m)$ from k=$m_2$ to $m_1$+1 in a memory 54.

The shift-probability calculation unit 52 subsequently calculates the probabilities $\gamma_{0,k}, \gamma_{1,k}, \gamma_{2,k}, \gamma_{3,k}$ using the receive data ($y_{ak}, y_{bk}$) at time k (=$m_1$+1). Further, the forward-probability calculation unit 53 assumes k=$m_1$+1 and calculates the forward probabilities $\alpha^1_k(m)$, $\alpha^0_k(m)$, in each state m (=0 to 3) at time k using the forward probabilities $\alpha^1_{k-1}(m)$, $\alpha^0_{k-1}(m)$ at time (k−1) and the obtained shift probabilities $\gamma_{0,k}, \gamma_{1,k}, \gamma_{2,k}, \gamma_{3,k}$ at time k. The joint-probability calculation unit 56 and the $u_k$ and $u_k$ likelihood calculation unit 57 perform operations similar to those described above and output $u_k$ and the likelihood L($u_k$).

Thereafter, the shift-probability calculation unit 52, forward-probability calculation unit 55, joint-probability calculation unit 56 and the $u_k$ and $u_k$ likelihood calculation unit 57 repeat the foregoing calculations at k=k+1, perform the calculations from k=$m_1$+1 to k=$m_2$, calculate $u_k$ and the confidence (likelihood) L($u_k$) thereof at each time from k=$m_1$+1 to $m_2$ and output the same.

If the above operations are completed, then ($m_2$+1)th to Nth decoded data $u_{m2+1}$ to $u_N$ and likelihoods L($u_{m2+1}$) to L($u_N$) are subsequently obtained in similar fashion.

In accordance with the first aspect of the present invention, just r×m (number of states) of memory capacity is needed to store backward probabilities in a case where $m_1$=r, $m_2$=2 r, $m_3$ =3 r . . . holds. Moreover, since the backward probabilities are calculated from k=N at all times, backward probability $\beta_k(m)$ is calculated accurately to make it possible to raise the precision of MAP decoding.

(C) Second Embodiment
(a) Operation Sequence

Figure 7:
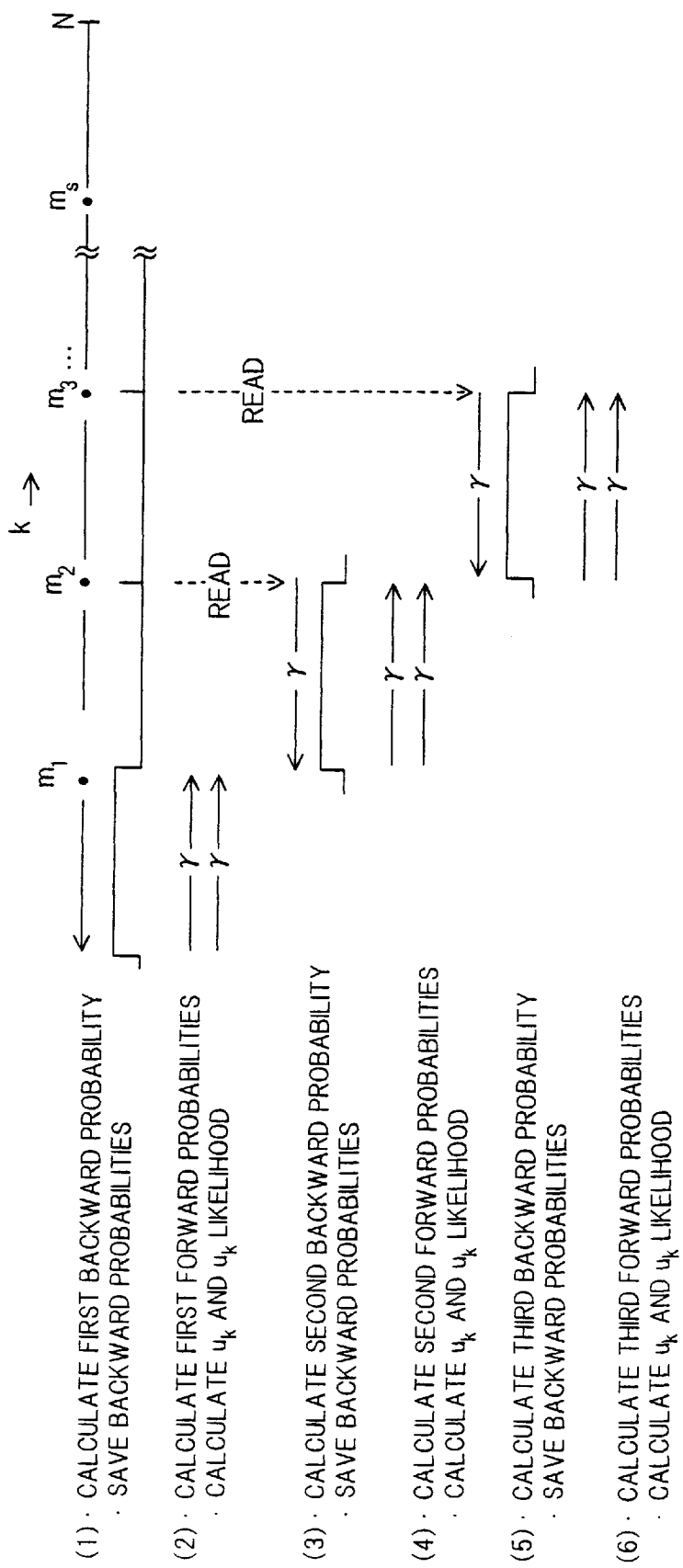
FIG. 7 is a diagram useful in describing the operation sequence of a second MAP decoding method according to the present invention.

FIG. 7 is a diagram useful in describing the operation sequence of a second MAP decoding method according to the present invention.

(1) At the beginning, all backward probabilities $\beta_k(m)$ (k=N to 1) are calculated in the reverse direction up to a first backward probability at k=1 starting from an Nth backward probability at k=N, an $m_s$th backward probability $\beta m_s(m)$, $m_{(s-1)}$th backward probability $\beta m_{(s-1)}(m)$, . . . , $m_3$th backward probability $\beta m_3(m)$, $m_2$th backward probability $\beta m_2(m)$ are saved discretely and an $m_1$th backward probability $\beta m_1(m)$ to a first backward probability $\beta_1(m)$ are saved continuously.

(2) Next, first forward probabilities $\alpha^1_1(m)$, $\alpha^0_1(m)$ are calculated, first decoded data $u_1$ and likelihood L($u_1$) are obtained using the first forward probabilities and the saved first backward probability $\beta_1(m)$, and second to $m_1$th decoded data $u_2$ to $u_{m1}$ and likelihoods L($u_2$) to L($u_{m1}$) are obtained in similar fashion.

(3) Thereafter, backward probabilities up to a ($m_1$+1)th backward probability $\beta_{m1+1}(m)$ are calculated and stored starting from the saved $m_2$th backward probability $\beta m_2(m)$.

(4) Next, ($m_1$+1)th forward probabilities $\alpha^1_{m1+1}(m)$, $\alpha^0_{m1+1}(m)$ are calculated, ($m_1$+1)th decoded data $u_{m1+1}$ and likelihood L ($u_{m1+1}$) are obtained using the ($m_1$+1)th forward probabilities and the saved $(m_1+1)$th backward probability $\beta_{m1+1}(m)$, and $(m_1+2)$th to $m_2$th decoded data $u_{m1+2}$ to $u_{m2}$ and likelihoods $L(u_{m1+2})$ to $L(u_{m2})$ are obtained in similar fashion.

(5) Thereafter, backward probabilities up to a $(m_2+1)$th backward probability $\beta_{m2+1}(m)$ are calculated and stored starting from the saved $m_3$th backward probability $\beta m_3(m)$.

(6) Next, $(m_2+1)$th forward probabilities $\alpha^1_{m2+1}(m)$, $\alpha^0_{m2+1}(m)$ are calculated, $(m_2+1)$th decoded data $u_{m2+1}$ and likelihood $L(u_{m2+1})$ are obtained using the $(m_2+1)$th forward probabilities and the saved $(m_2+1)$th backward probability $\beta_{m2+1}(m)$, and $(m_2+2)$th to $m_3$th decoded data $u_{m2+2}$ to $u_{m3}$ and likelihoods $L(u_{m2+2})$ to $L(u_{m3})$ are obtained in similar fashion.

(7) Thereafter, and in similar fashion, $(m_3+1)$th to Nth decoded data $u_{m3+1}$ to $u_N$ and likelihoods $L(u_{m3+1})$ to $L(u_N)$ are obtained using the saved $m_4$th backward probability $\beta_{m4}(m)$, . . . , $m_{(s-1)}$th backward probability $\beta m_{(s-1)}$, $m_s$th backward probability $\beta m_s(m)$.

(b) MAP Decoder of Second Embodiment

Figure 8:
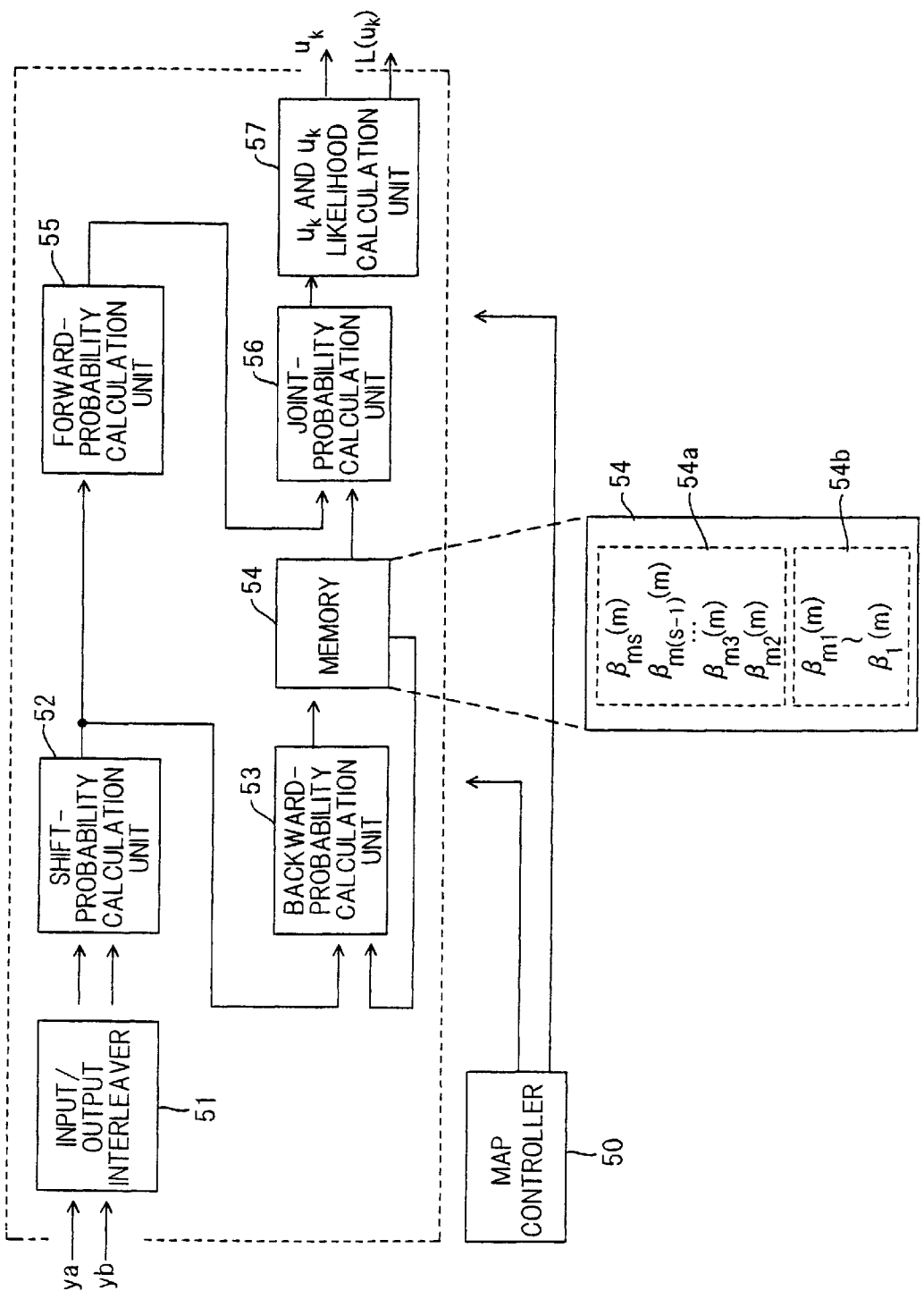
FIG. 8 is a block diagram of a MAP decoder according to a second embodiment.

FIG. 8 is a block diagram of a MAP decoder according to the second embodiment, in which components identical with those shown in FIG. 6 are designated by like reference characters.

The MAP controller 50 controls the overall MAP decoder, i.e., controls the calculation timing of each component and the read-out and writing of data from and to memory, etc., in accordance with the operation sequence of FIG. 7. The input/output interleaver 51, which is for changing the output sequence of receive data as appropriate, has a memory for storing all receive data and a data output unit for outputting the receive data in an order that is the reverse of or the same as that in which the data was input.

The shift-probability calculation unit 52 uses receive data $(y_{ak}, y_{bk})$ at time k (=N) to calculate the following:
  probability $\gamma_{0,k}$ that $(x_{ak}, x_{bk})$ is (0,0)
  probability $\gamma_{1,k}$ that $(x_{ak}, x_{bk})$ is (0,1)
  probability $\gamma_{2,k}$ that $(x_{ak}, x_{bk})$ is (1,0)
  probability $\gamma_{3,k}$ that $(x_{ak}, x_{bk})$ is (1,1)

Further, a backward-probability calculation unit 53 calculates the backward probability $\beta_{k-1}(m)$ (m=0 to 3) in each state m (=0 to 3) at time k−1 using the backward probability $\beta_k(m)$ and shift probability $\gamma_{s,k}$ (s=0, 1, 2, 3) at time k (=N). Thereafter, the shift-probability calculation unit 52 and backward-probability calculation unit 53 repeat the above-described calculations at k=k−1 and perform the calculations from k=N to k=1. The backward-probability calculation unit 53 stores the $m_s$th backward probability $\beta m_s(m)$, $m_{(s-1)}$th backward probability $\beta m_{s-1}(m)$, . . . , $m_3$th backward probability $\beta m_3(m)$, $m_2$th backward probability $\beta m_2(m)$, which are obtained discretely in concurrence with the calculation of backward probabilities from k=N to 1, in a discrete backward probability storage section 54a of memory 54, and stores the $m_1$th backward probability $\beta m_1(m)$ to the first backward probability $\beta_1(m)$ in a continuous backward probability storage section 54b.

The shift-probability calculation unit 52 subsequently uses the receive data $(y_{ak}, y_{bk})$ at time k (=1) to calculate the following:
  probability $\gamma_{0,k}$ that $(x_{ak}, x_{bk})$ is (0,0)
  probability $\gamma_{1,k}$ that $(x_{ak}, x_{bk})$ is (0,1)
  probability $\gamma_{2,k}$ that $(x_{ak}, x_{bk})$ is (1,0)
  probability $\gamma_{3,k}$ that $(x_{ak}, xb_k)$ is (1,1)

Further, the forward-probability calculation unit 55 assumes k=1 and calculates the forward probabilities $\alpha^1_k(m)$, $\alpha^0_k(m)$ at time k using the forward probabilities $\alpha^1_{k-1}(m)$, $\alpha^0_{k-1}(m)$ at time (k−1) and the obtained shift probabilities $\gamma_{0,k}$, $\gamma_{1,k}$, $\gamma_{2,k}$, $\gamma_{3,k}$ at time k.

The joint-probability calculation unit 56 multiplies the forward probability $\alpha^1_k(m)$ and backward probability $\beta_k(m)$ in each state m (=0 to 3) at time k to calculate the probability $\lambda^1_k(m)$ that the kth item of original data $u_k$ is "1", and similarly calculates the probability $\lambda^0_k(m)$ that the original data $u_k$ is "0" using the forward probability $\alpha^0_k(m)$ and backward probability $\beta_k(m)$ in each state m (=0 to 3) at time k.

A $u_k$ and $u_k$ likelihood calculation unit 57 obtains sum total $\Sigma_m \lambda^0_k(m)$ of the probabilities of "0" and the sum total $\Sigma_m \lambda^1_k(m)$ of the probabilities of "1" in each state m (=0 to 3) at time k and outputs the likelihood in accordance with the following equation:

$$L(u) = \log [\Sigma_m \lambda^1_k(m)/\Sigma_m \lambda^0_k(m)]$$

Further, the decoded result $u_k=1$ is output if $L(u)>0$ holds and the decoded result $u_k=0$ is output if $L(u)<0$ holds.

Thereafter, the shift-probability calculation unit 52, forward-probability calculation unit 55, joint-probability calculation unit 56 and $u_k$ and $u_k$ likelihood calculation unit 57 repeat the foregoing calculations at k=k+1, perform the calculations from k=1 to k=$m_1$, calculate $u_k$ and the confidence (likelihood) $L(u_k)$ thereof at each time from k=1 to $m_1$ and output the same.

If the calculation of $u_k$ and $L(u_k)$ from k=1 to k=$m_1$ is completed, then, under the control of the MAP controller 50, the shift-probability calculation unit 52 calculates the probabilities $\gamma_{0,k}$, $\gamma_{1,k}$, $\gamma_{2,k}$, $\gamma_{3,k}$ using the receive data $(y_{ak}, y_{bk})$ at time k (=$m_2$). Further, the backward-probability calculation unit 53 reads the backward probability $\beta_k(m)$ [=$\beta_{m2}(m)$] at time k (=$m_2$) out of the storage section 54a, calculates the backward probability $\beta_{k-1}(m)$ (m=0 to 3) in each state m (=0 to 3) at time k−1 using the backward probability $\beta_k(m)$ and shift probability $\gamma_{s,k}$ (s=0, 1, 2, 3) and stores the same in the storage section 54b. The shift-probability calculation unit 52 and backward-probability calculation unit 53 subsequently repeat the above calculations at k=k−1, perform calculations from k=$m_2$ to k=$m_1$+1 and save the $m_2$th backward probability $\beta_{m2}(m)$ to the $(m_1+1)$th backward probability $\beta_{m1+1}(m)$ from k=$m_2$ to k=$m_1$+1 in the storage section 54b.

The shift-probability calculation unit 52 subsequently calculates the probabilities $\gamma_{3,k}$, $\gamma_{1,k}$, $\gamma_{2,k}$, $\gamma_{3,k}$ using the receive data $(y_{ak}, y_{bk})$ at time k (=$m_1$+1). Further, the forward-probability calculation unit 53 assumes k=$m_1$+1 and calculates the forward probabilities $\alpha^1_k(m)$, $\alpha^0_k(m)$ in each state m (=0 to 3) at time k using the forward probabilities $\alpha^1_{k-1}(m)$, $\alpha^0_{k-1}(m)$ at time (k−1) and the obtained shift probabilities $\gamma_{0,k}$, $\gamma_{1,k}$, $\gamma_{2,k}$, $\gamma_{3,k}$ at time k. The joint-probability calculation unit 56 and $u_k$ and $u_k$ likelihood calculation unit 57 perform operations similar to those described above and output $u_k$ and the likelihood $L(u_k)$.

Thereafter, the shift-probability calculation unit 52, forward-probability calculation unit 55, joint-probability calculation unit 56 and the $u_k$ and $u_k$ likelihood calculation unit 57 repeat the foregoing calculations at k=k+1, perform the calculations from k=$m_1$+1 to k=$m_2$, calculate $u_k$ and the confidence (likelihood) $L(u_k)$ thereof at each time from k=$m_1$+1 to $m_2$ and output the same.

Thereafter, $(m_2+1)$th to Nth decoded data $u_{m2+1}$ to $u_N$ and likelihoods $L(u_{m2+1})$ to $L(u_N)$ are subsequently obtained in similar fashion.

In accordance with the second aspect of the present invention, just r×m+(s−1) (m: number of states) of memory capacity is needed to store backward probabilities in a case where $m_1$=r, $m_2$=2 r, $m_3$=3 r . . . holds. Further, it is so arranged that backward probabilities are calculated in the reverse direction from an Nth backward probability to a first backward probability, the obtained backward probabilities are stored discretely and, if necessary, backward probabilities of the required number are calculated and utilized starting from one of the discretely stored backward probabilities. As a result, backward probability $\beta_k(m)$ can be calculated accurately to make it possible to raise the precision of MAP decoding.

(C) Turbo Decoder

Figure 9:
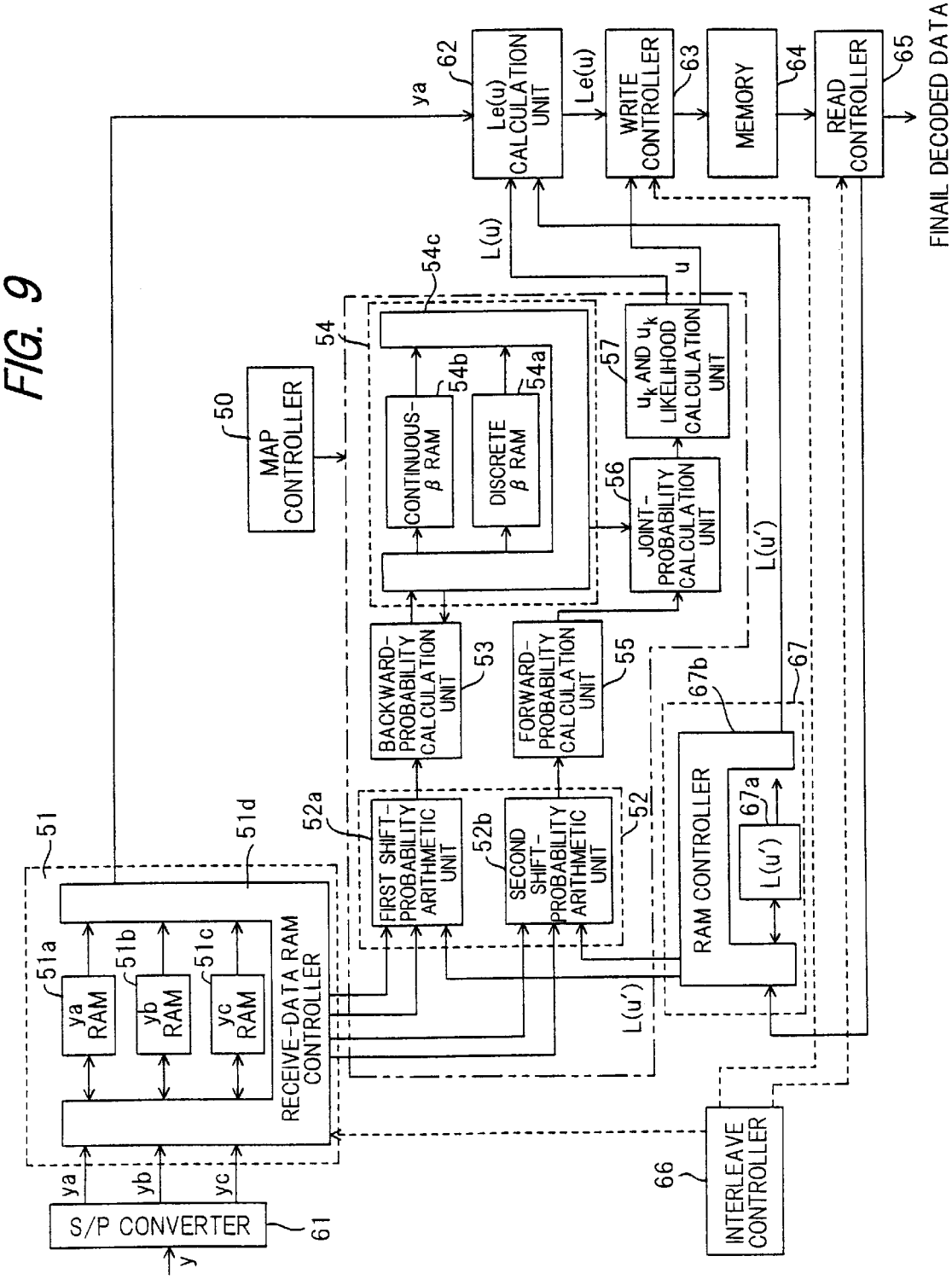
FIG. 9 is a block diagram of the turbo decoder.

FIG. 9 is a block diagram illustrating a case where a MAP decoder according to the present invention is used as the element decoders DEC1, DEC2 in a turbo decoder (see FIG. 4). It is so arranged that the decoding operation in the element decoders DEC1, DEC2 is performed by a single MAP decoder. Components identical with those of the MAP decoder in FIG. 8 are designated by like reference characters.

The MAP controller 50 controls the various timings of the MAP decoder in accordance with the operation sequence shown in FIG. 7. The input/output interleaver 51, which has RAMs 51a to 51c for storing receive data ya, yb, yc and a RAM controller 51d for controlling the reading and writing of receive data, outputs receive data in the order in which the data was input and, when appropriate, changes the output sequence to perform interleaving of the receive data. The shift-probability calculation unit 52, which calculates shift probability, has first and second arithmetic units 52a, 52b. The backward-probability calculation unit 53 calculates backward probabilities, as described in conjunction with FIGS. 7 and 8. The memory 54, which stores the backward probabilities, has the RAM 54a for discretely storing backward probabilities, the RAM 54b for storing backward probabilities continuously, and a RAM controller 54c for controlling the reading and writing of backward probabilities. The forward-probability calculation unit 55 calculates forward probabilities. The joint-probability calculation unit 56 multiplies the forward and backward probabilities together to calculate the probability that the kth item of data $u_k$ is "1" and the probability that it is "0". The likelihood calculation unit 57 outputs the decoded results u and the a posteriori probability L(u).

An S/P converter 61 subjects the receive data to a serial-to-parallel conversion and inputs the converted data to the input/output interleaver 51. The receive data ya, yb, yc obtained by the conversion is soft-decision data quantized at n bits. An external-information likelihood calculation unit 62 outputs external-information likelihood Le(u). In a first cycle of MAP decoding, the external-information likelihood calculation unit 62 outputs the external-information likelihood Le(u) using the a posteriori probability L(u) output from the likelihood calculation unit 57 and the MAP-decoder input signal (=signal ya). A write controller 63 writes the external-information likelihood Le(u) to a memory 64. A read-out controller 65 subjects the external-information likelihood Le(u) to interleaving and deinterleaving as appropriate by reading the external-information likelihood Le(u) out of the memory 64, and outputs the result as a posteriori likelihood L(u') used in the next cycle of MAP decoding.

In MAP decoding from the second cycle onward, turbo decoding is such that [signal ya+a posteriori likelihood L(u')] is used as the input signal ya. Accordingly, in the second cycle of MAP decoding, the external-information likelihood calculation unit 62 outputs the external-information likelihood Le(u) using the a posteriori likelihood L(u) output from the likelihood calculation unit 57 and the decoder-input signal [=signal ya+a posteriori likelihood L(u')]. The write controller 63 writes the external-information likelihood Le(u) to the memory 64. The read-out controller 65 subjects the external-information likelihood Le(u) to interleaving and deinterleaving as appropriate by reading the external-information likelihood Le(u) out of the memory 64, and outputs the result as a posteriori likelihood L(u') used in the next cycle of MAP decoding. The external-information likelihood Le(u) is output in similar fashion thereafter. The following equation is established using the log value of each value:

$$L(u) = Lya + L(u') + Le(u) \qquad (8)$$

The external-information likelihood calculation unit 62 therefore is capable of obtaining the external-information likelihood Le(u) in accordance with the following equation:

$$Le(u) = L(u) - Lya - L(u') \qquad (9)$$

where L(u')=0 holds the first time.

In a case where the write controller 63 finally outputs the decoded data u, the decoded data is written to the memory 64; otherwise, the write controller 63 writes the external-information likelihood Le(u) to the memory 64. In a case where the read-out controller 65 outputs the decoded data u, the read-out controller 65 reads the decoded data u out of the memory in the order in which the data was written. In a case where the read-out controller 65 reads out the external-information likelihood Le(u), the read-out controller 65 reads out and outputs (interleaves) the data in accordance with a read-out sequence specified by an interleave controller 66. A memory 67 has a RAM 67a and a RAM controller 67b and stores the interleaved external-information likelihood Le(u) as L(u').

Figure 10:
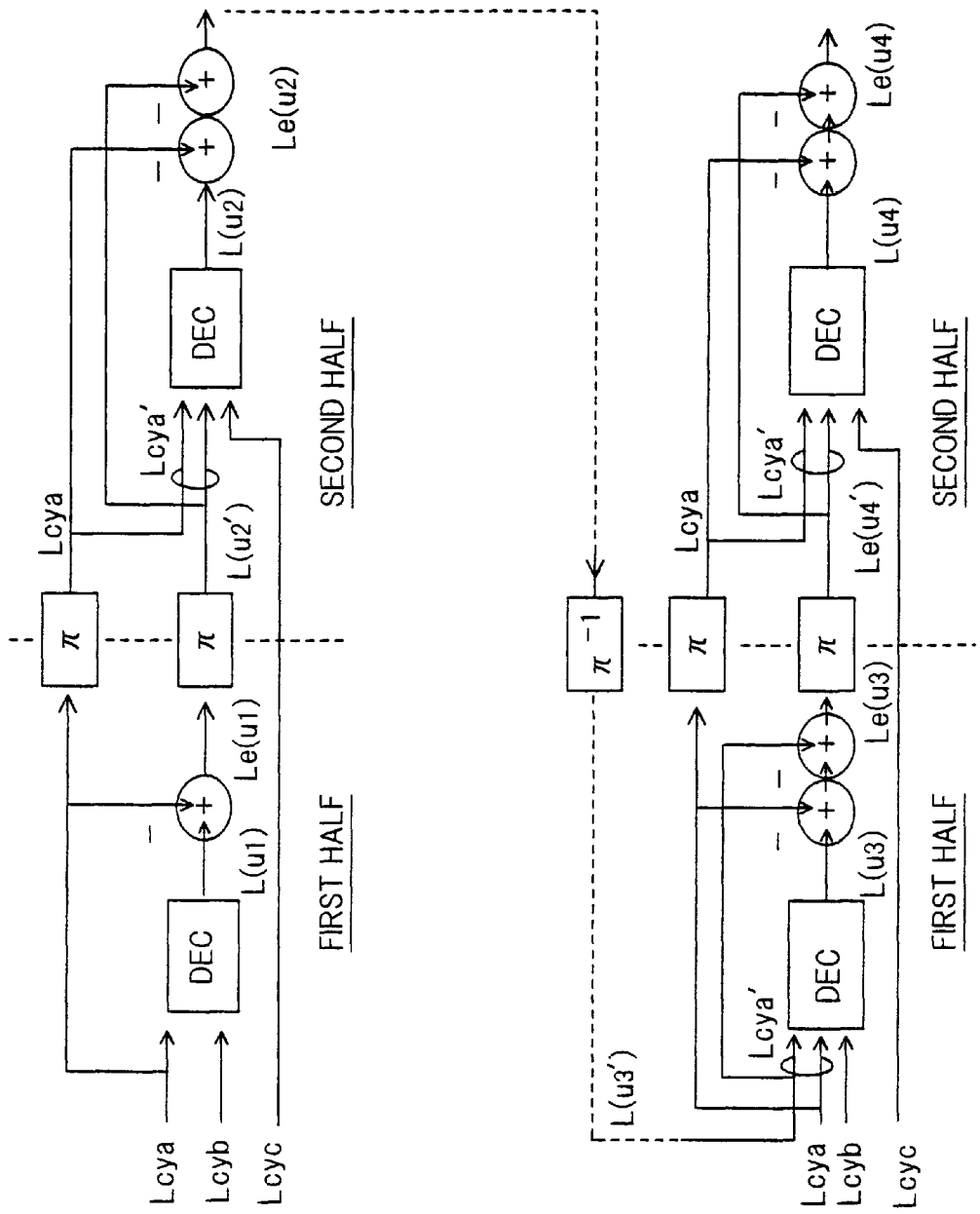
FIG. 10 is a diagram useful in describing the operation of the turbo decoder.
Figure 14:
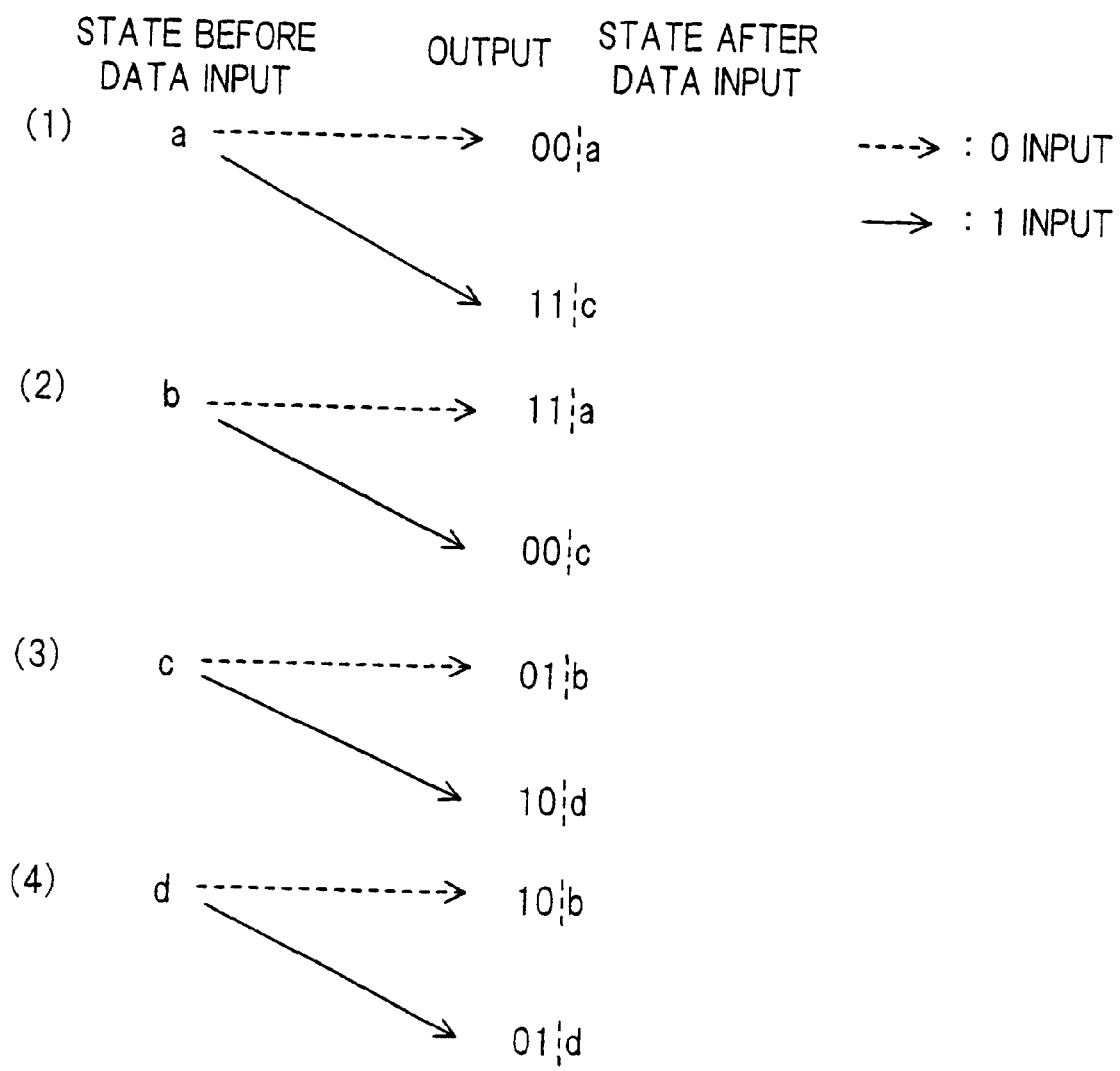
FIG. 14 is a diagram showing the relationship between the states and input/output of a convolutional encoder.
Figure 16:
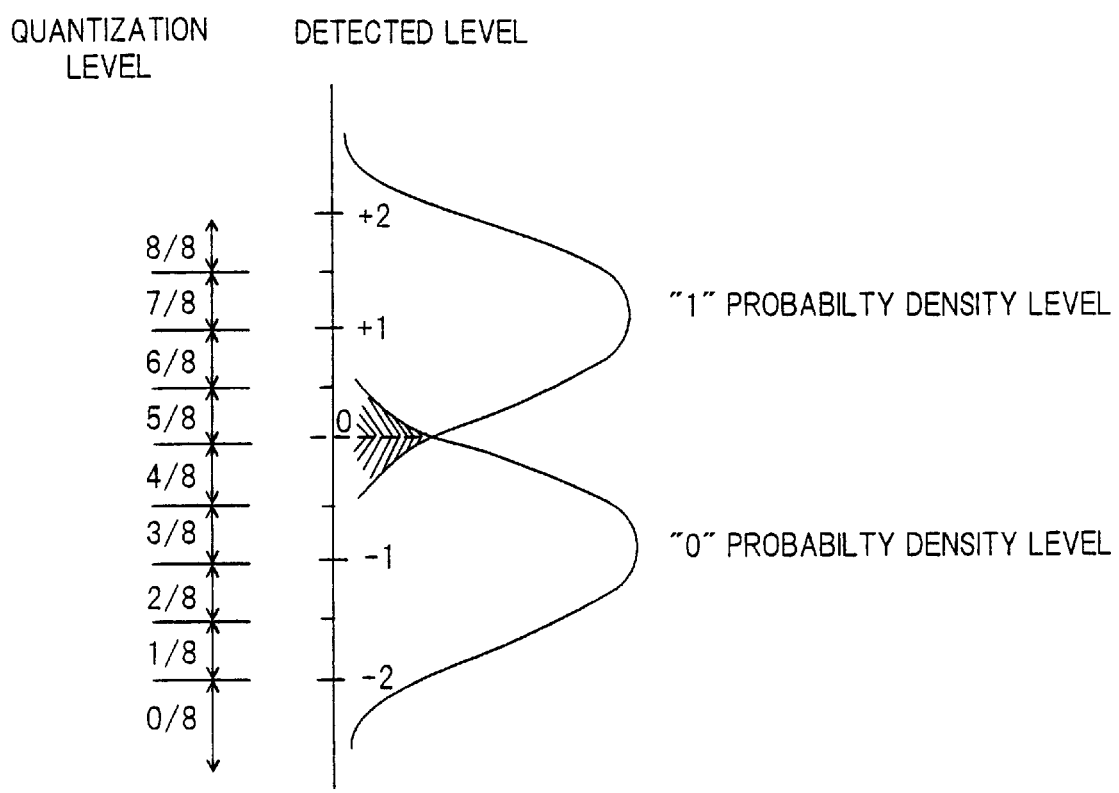
FIG. 16 is a diagram useful in describing hard and soft decisions.
Figure 17:
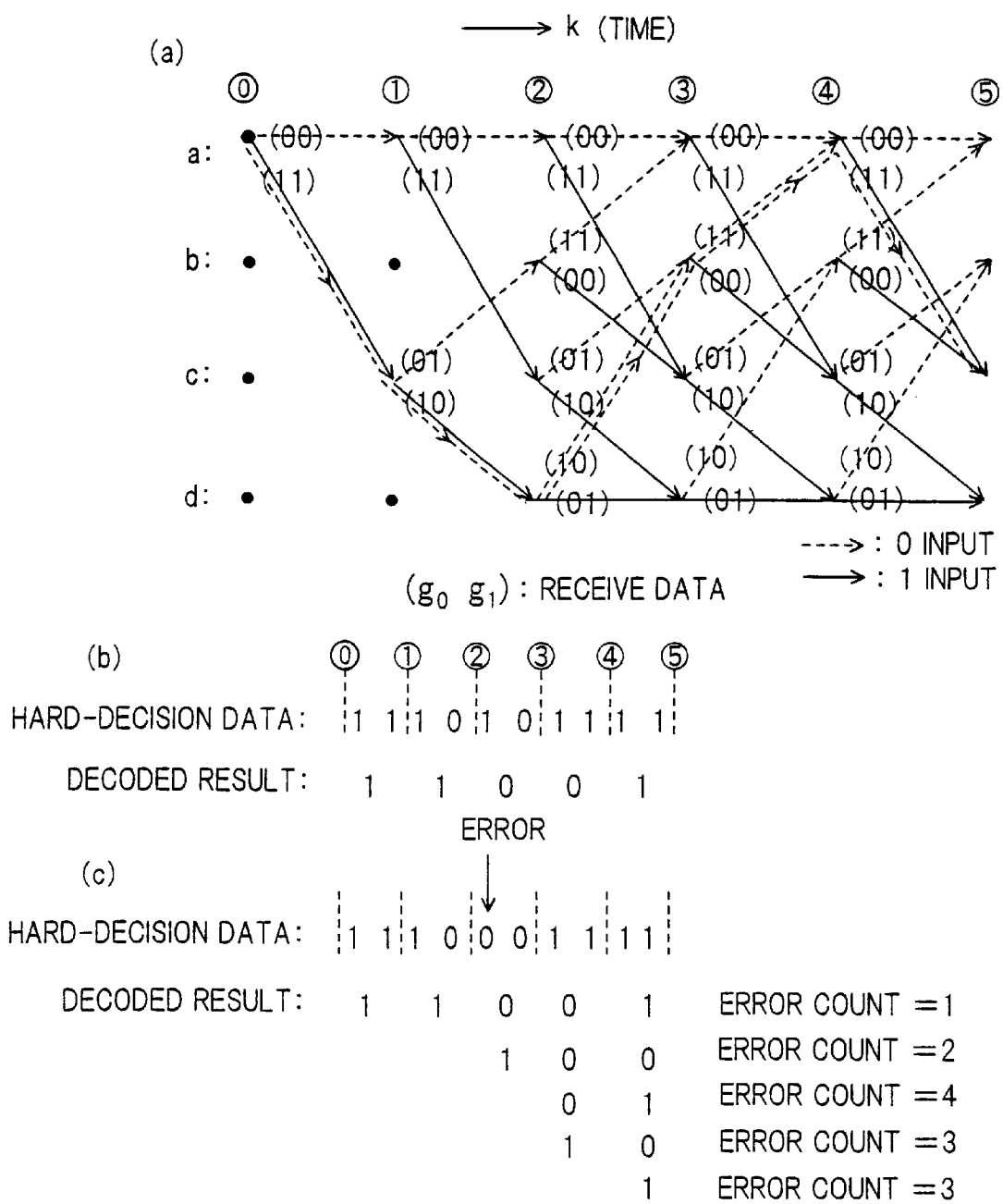
FIG. 17 is a diagram useful in describing decoding (hard decision) of a convolutional code.
Figure 18:
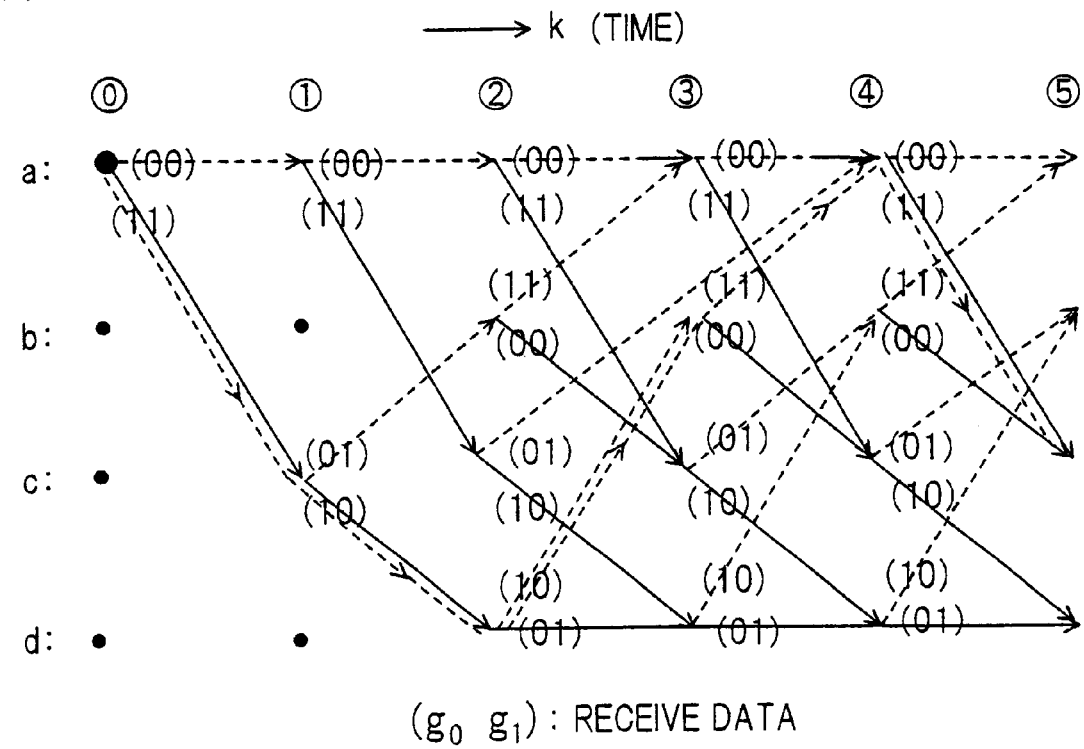
FIG. 18 is a diagram useful in describing decoding (soft decision) of a convolutional code.
Figure 19:
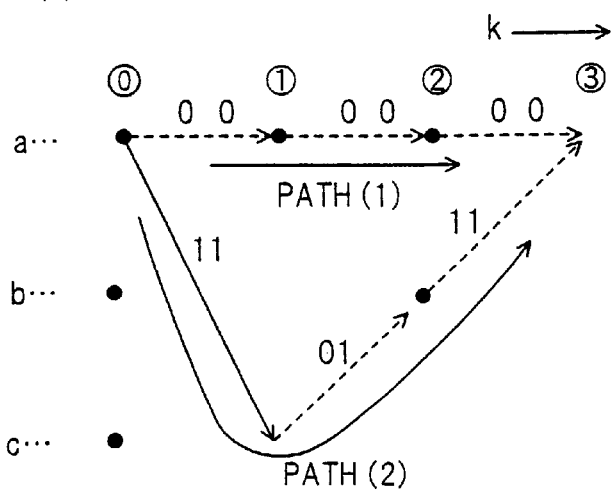
FIG. 19 is a diagram useful in describing decoding of a convolutional code.
Figure 20:
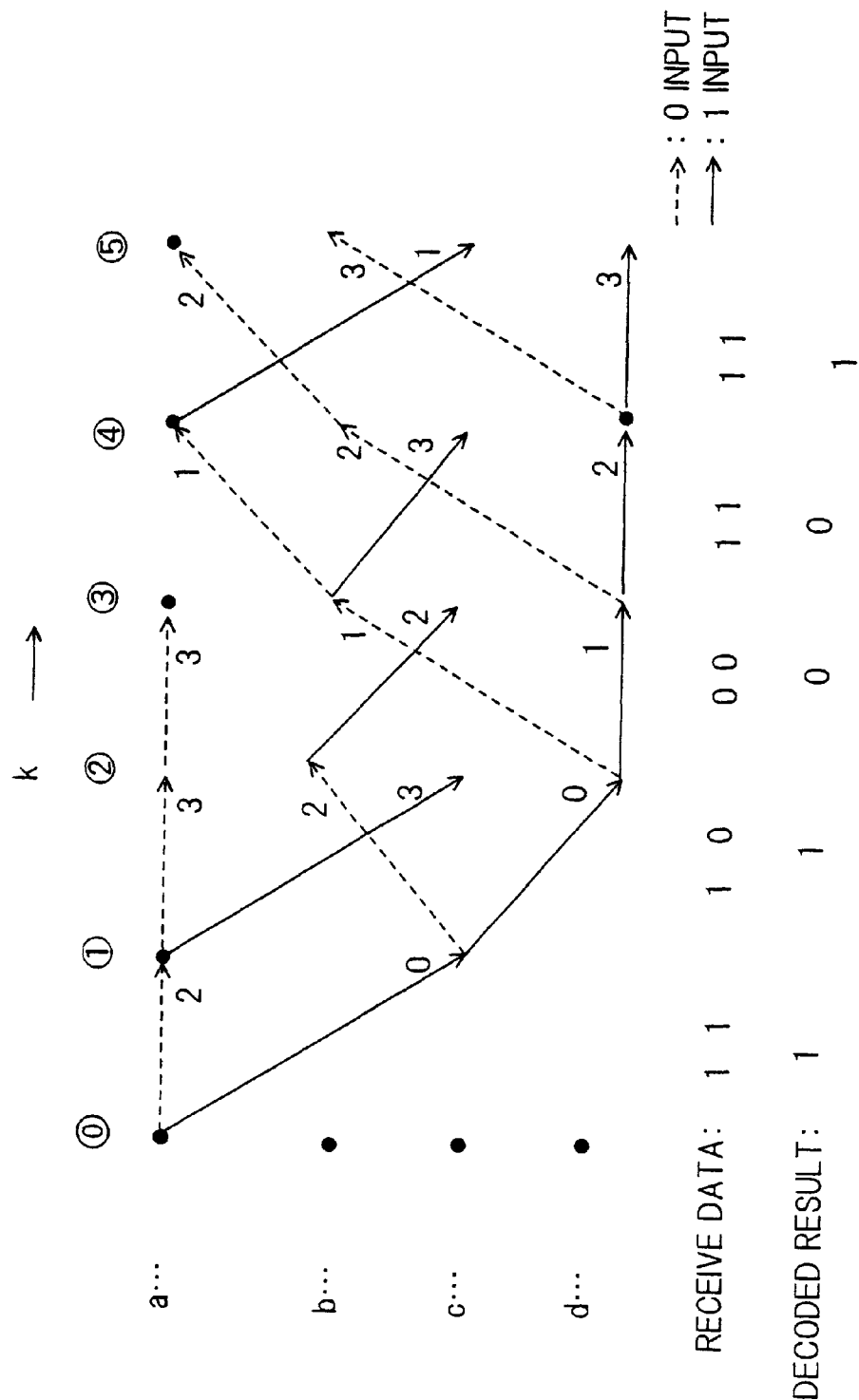
FIG. 20 is a diagram useful in describing a minimum error path of each state at any k.
Figure 21:
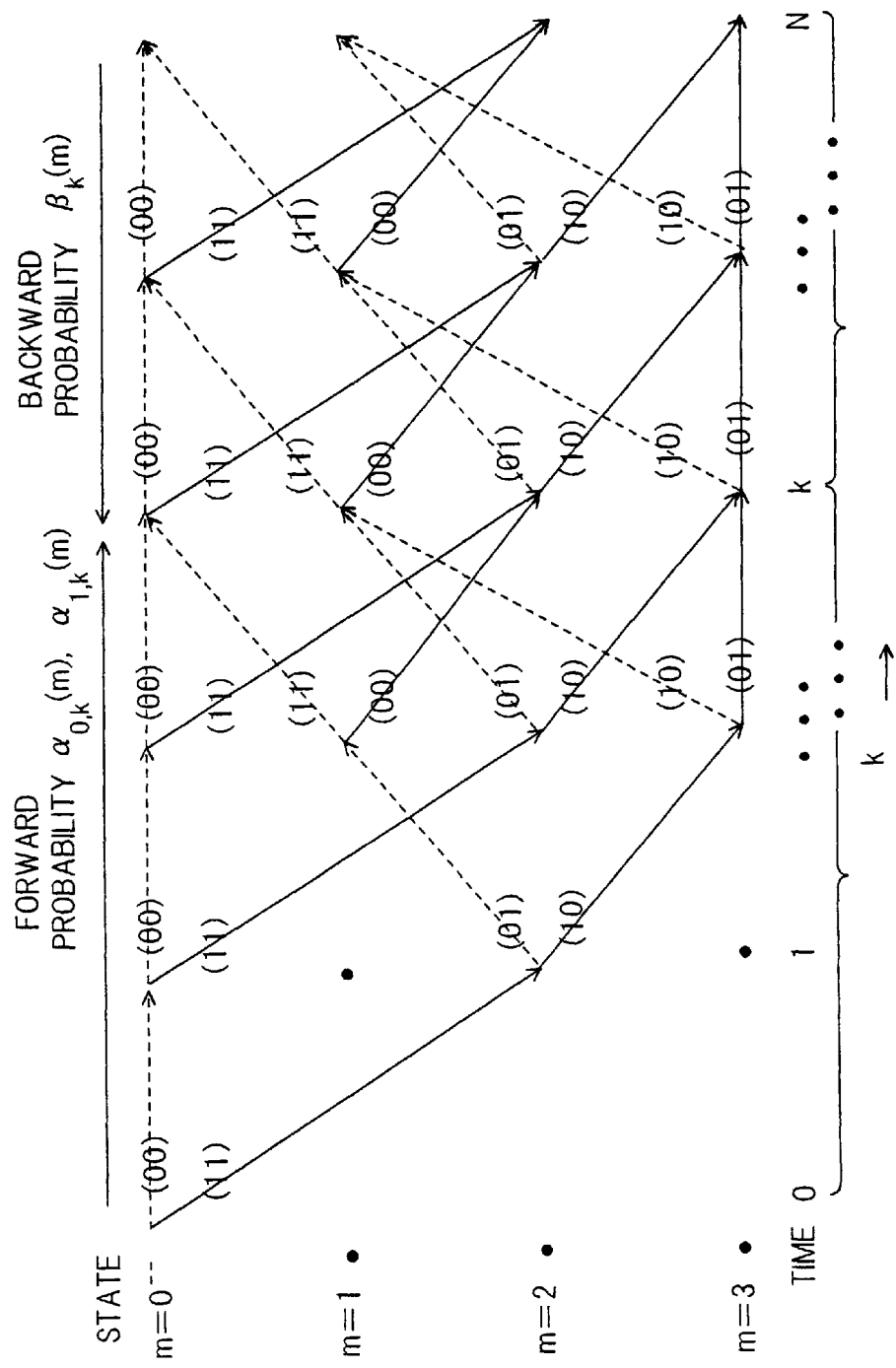
FIG. 21 is a diagram useful in describing an overview of MAP decoding.
Figure 22:
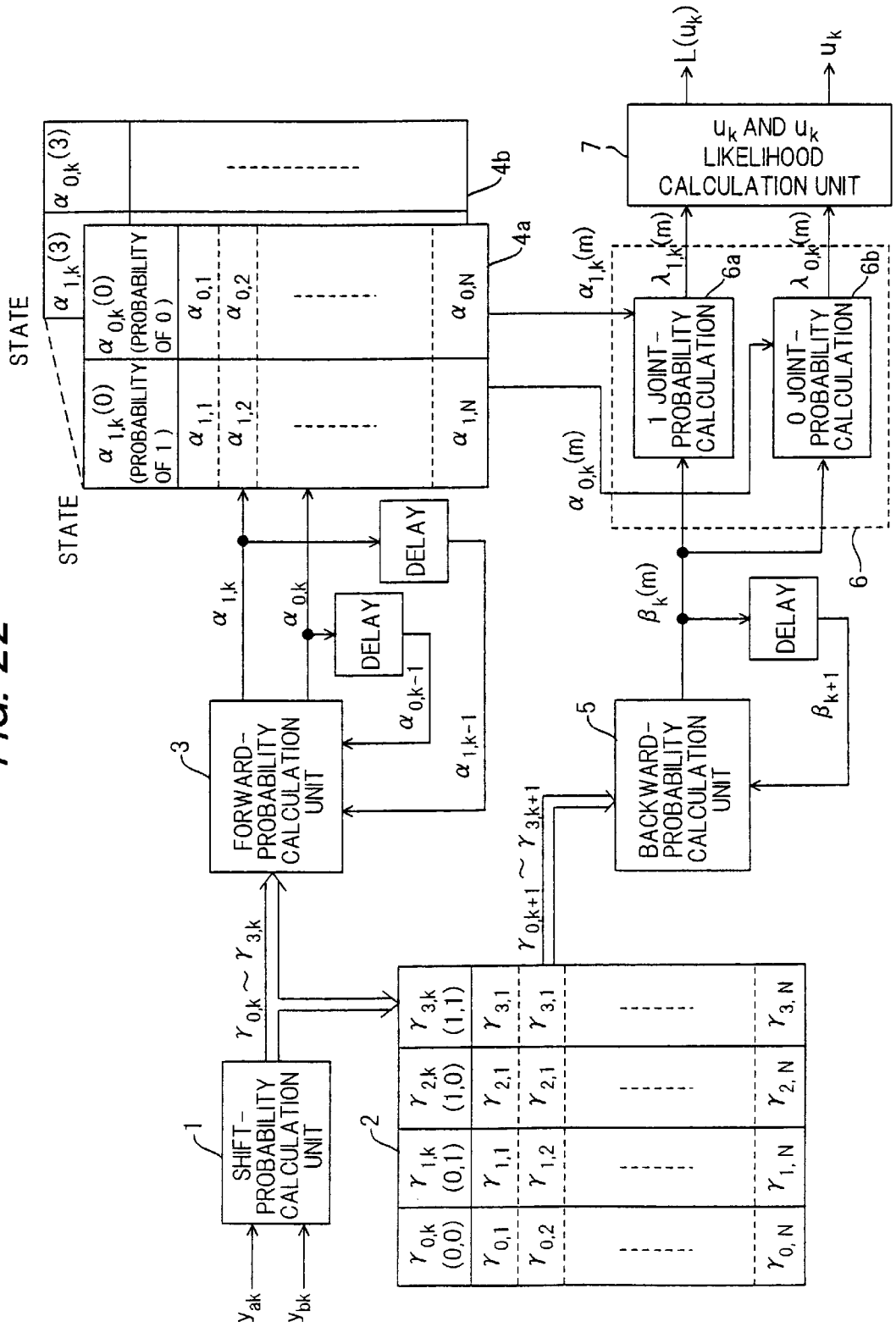
FIG. 22 is a block diagram of a MAP decoder for implementing a first MAP decoding method of the prior art.
Figure 23:
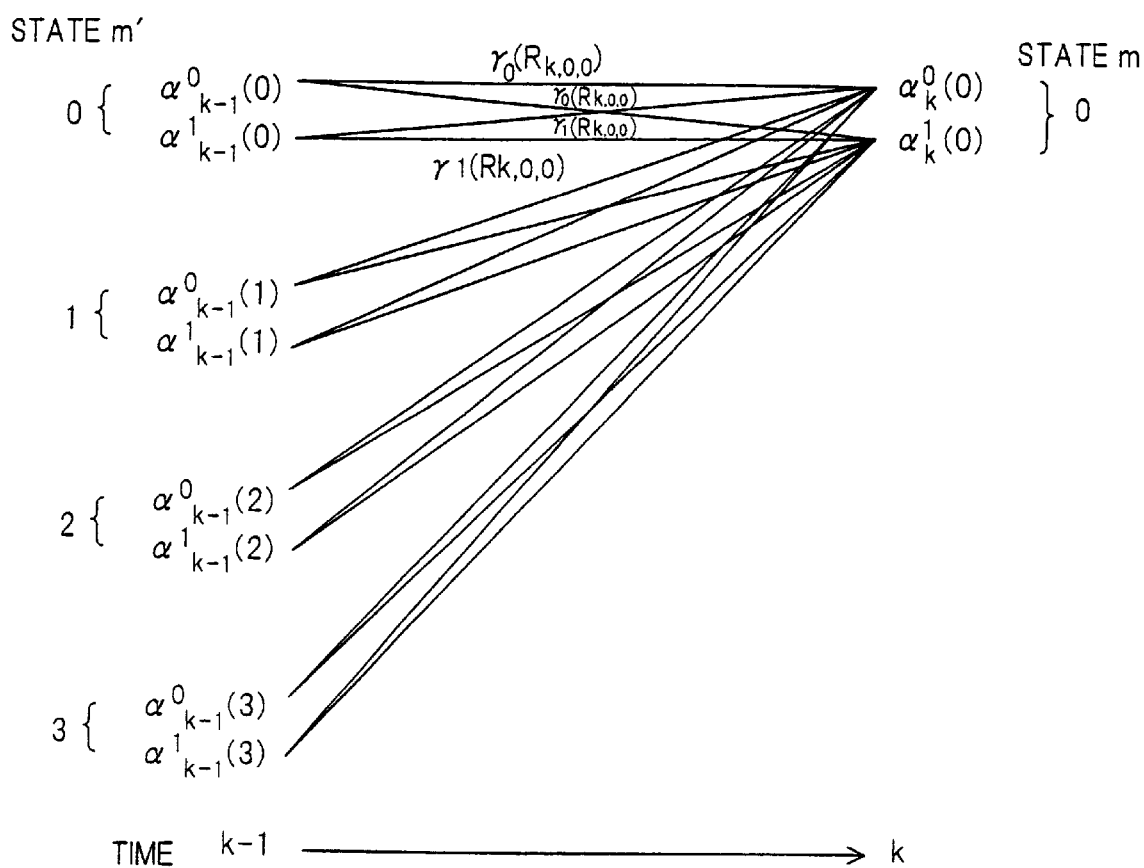
FIG. 23 is a diagram useful in describing calculation of forward probabilities.
Figure 27:
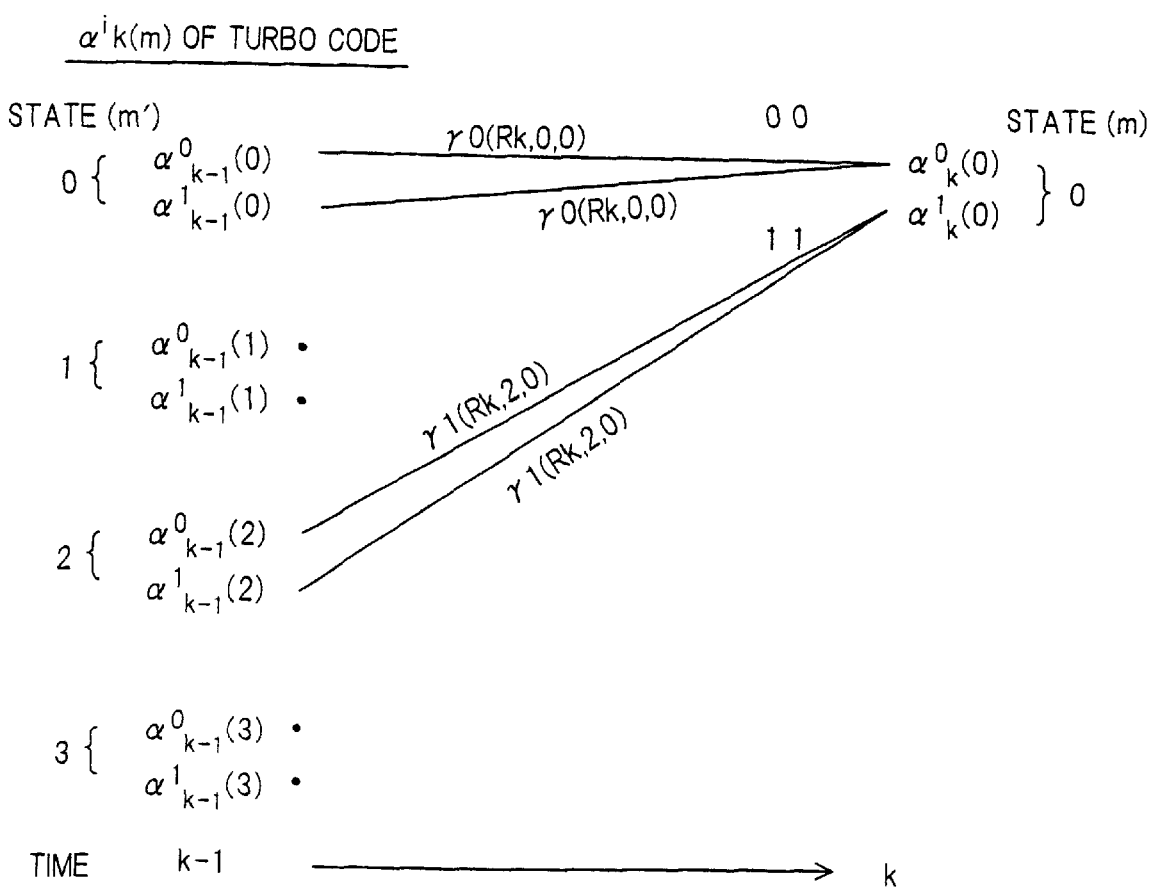
FIG. 27 is a diagram useful in describing calculation of forward probabilities from which lines of transition probability=0 have been eliminated.
Figure 28:
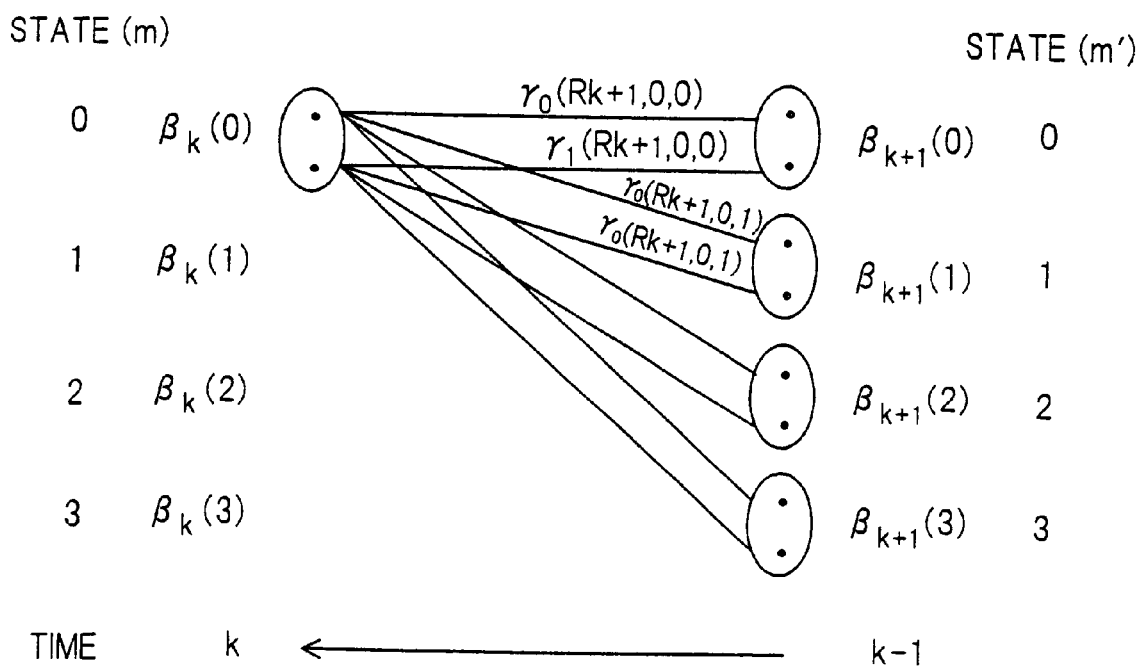
FIG. 28 is a diagram useful in describing calculation of backward probabilities.
Figure 29:
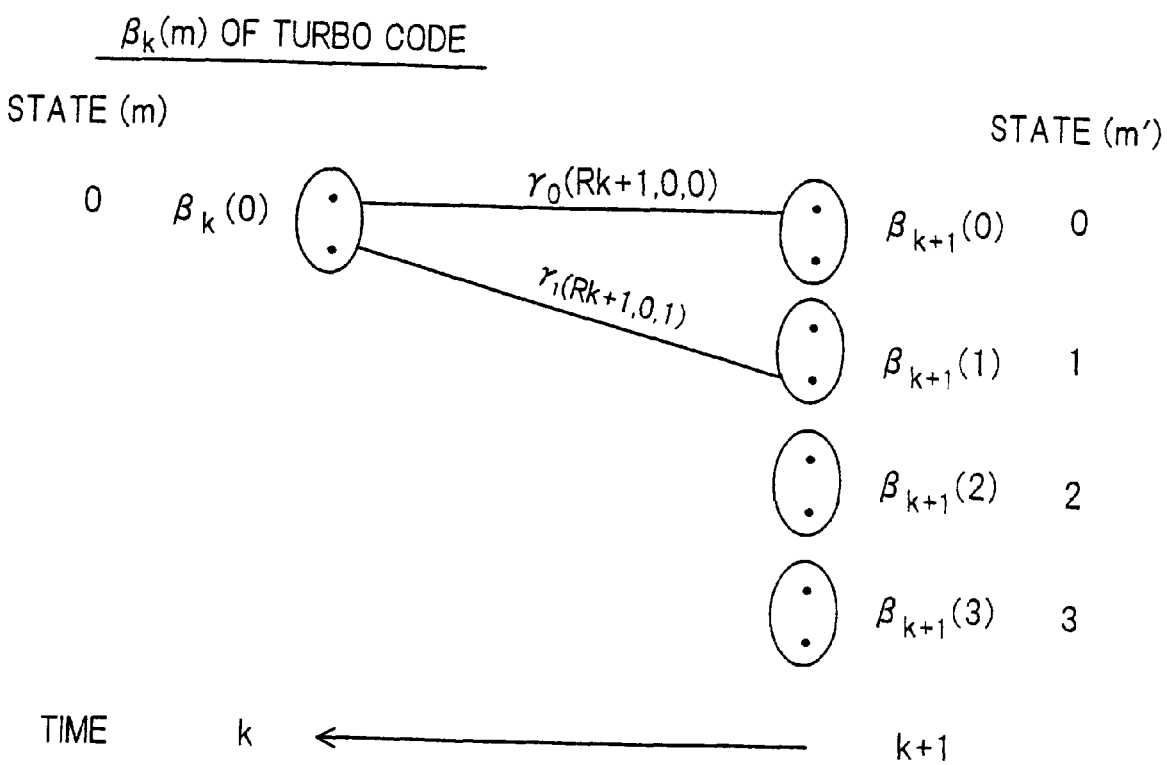
FIG. 29 is a diagram useful in describing calculation of backward probabilities from which lines of transition probability=0 have been eliminated.
Figure 30:
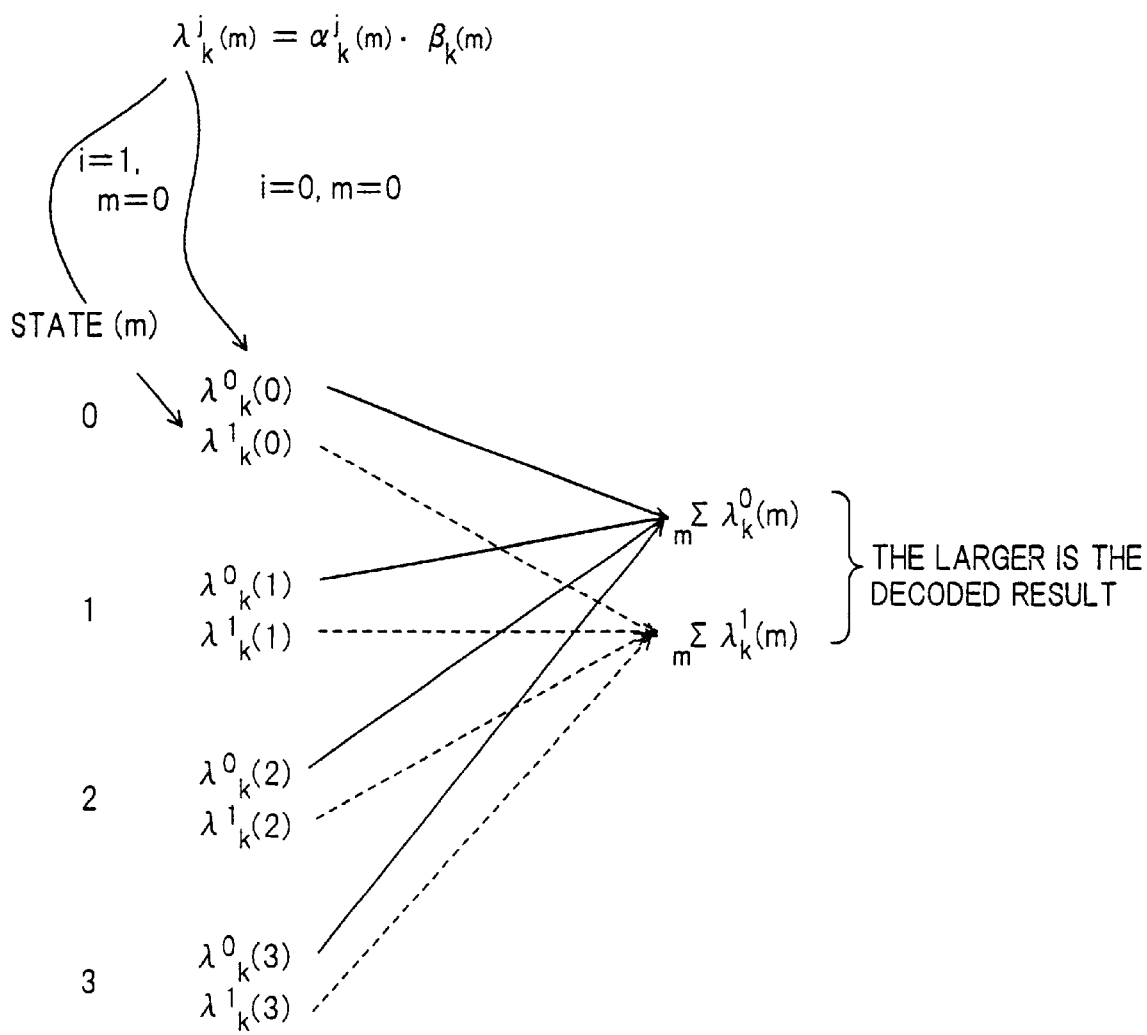
FIG. 30 is a diagram useful in describing calculation of joint probabilities and likelihood as well as results of decoding.
Figure 31:
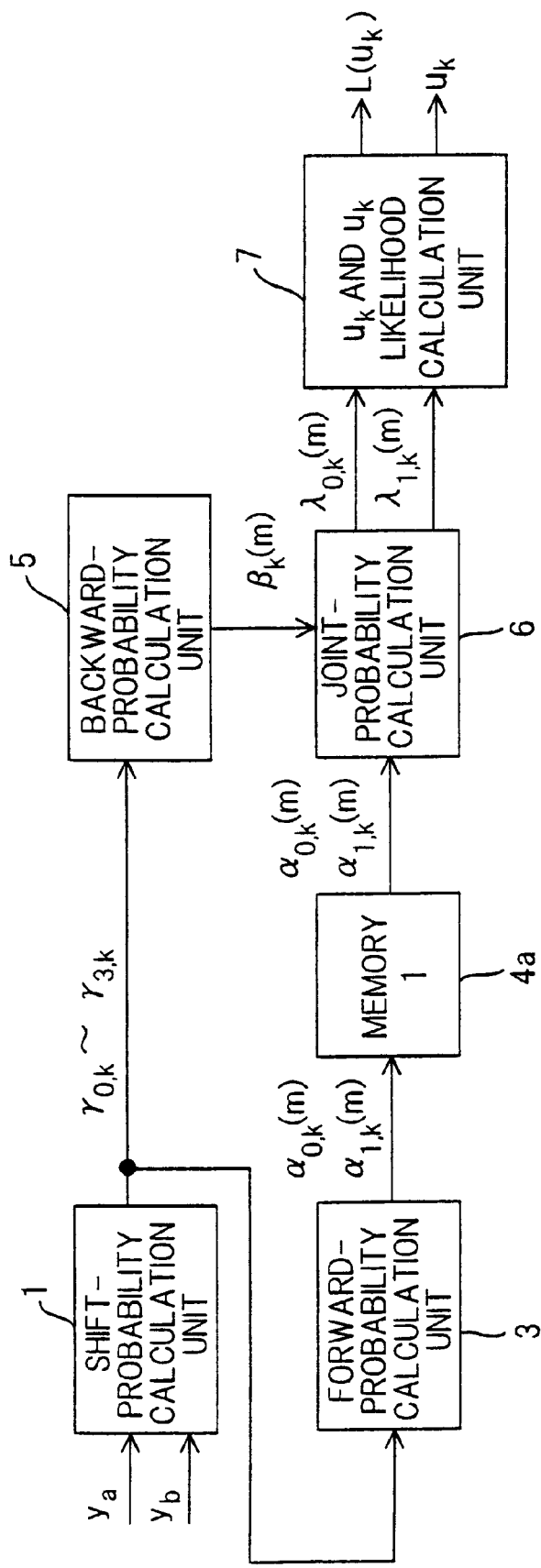
FIG. 31 is a modification of a MAP decoder for implementing the first MAP decoding method according to the prior art.
Figure 32:
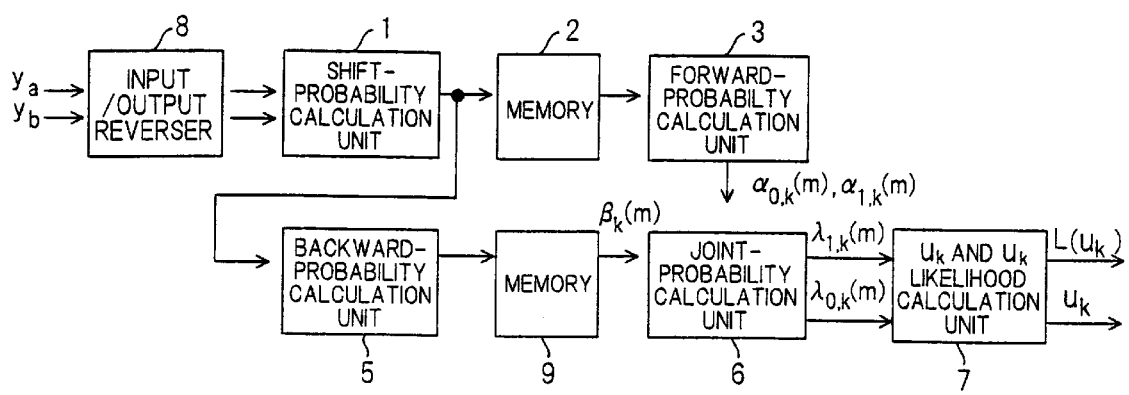
FIG. 32 is a modification of a MAP decoder for implementing the second MAP decoding method according to the prior art.
Figure 33:
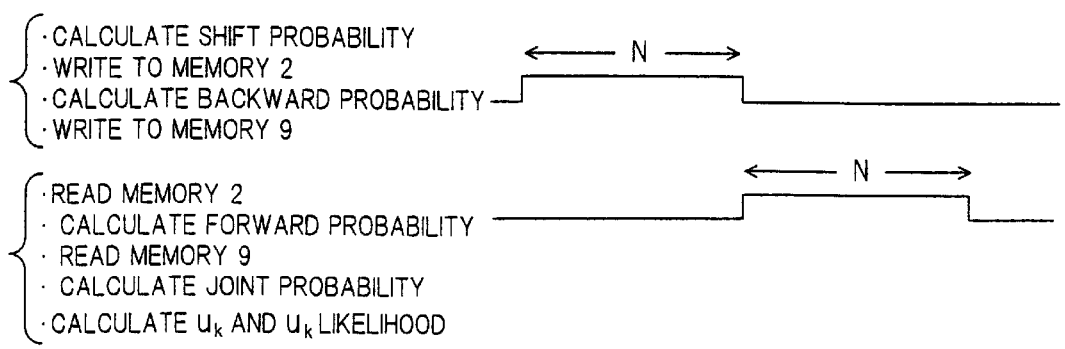
FIG. 33 is a time chart of the second MAP decoding method according to the prior art.
Figure 34:
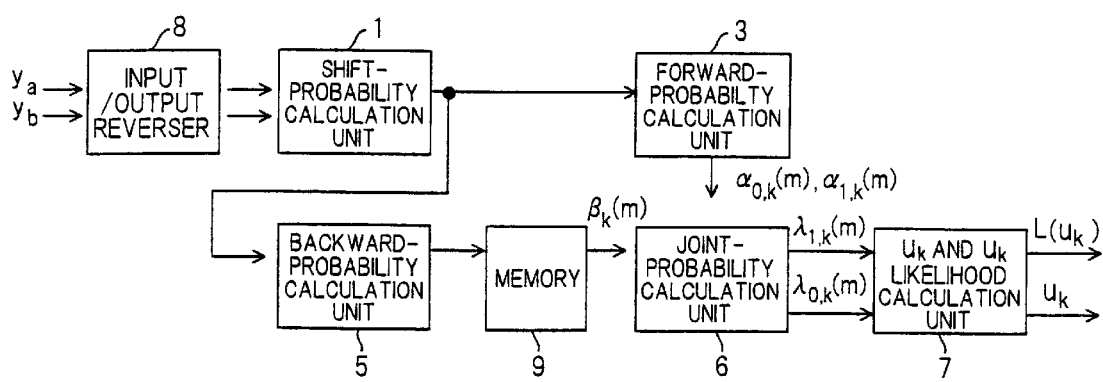
FIG. 34 is a modification of a MAP decoder for implementing the second MAP decoding method according to the prior art.
Figure 36:
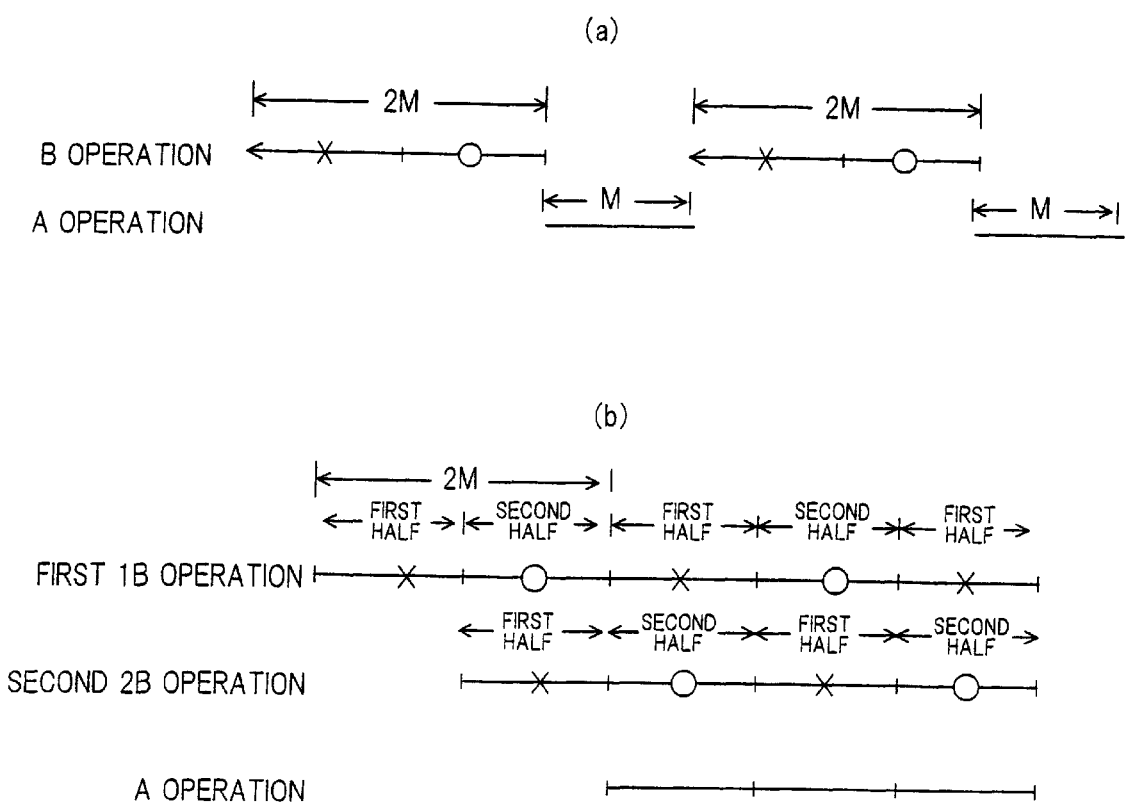
FIG. 36 is a diagram useful in describing problems of the third MAP decoding method according to the prior art.

FIG. 10 is a diagram useful in describing the sequence of turbo decoding. As is obvious from FIG. 4, turbo decoding is repeated a plurality of times treating a first half of decoding which uses ya, yb and a second half of decoding which uses ya, yc as one set.

In the first half of decoding processing the first time, decoding is performed using receive signals Lcya, Lcyb and the likelihood $L(u_1)$ obtained is output. Next, the a posteriori probability $Le(u_1)$ is obtained in accordance with Equation (9) [where $L(u_1')=0$ holds], this is interleaved and $L(u_2')$ is obtained.

In the second half of decoding processing the first time, a signal obtained by interleaving the receive signal Lcya and the posteriori likelihood $L(u_2')$ obtained in the first half of decoding processing are regarded as being a new receive signal Lcya', decoding is performed using Lcya' and Lcyc, and the likelihood $(u_2)$ obtained is output. Next, the a posteriori likelihood $Le(u_2)$ is found in accordance with Equation (9) and this is interleaved to obtain $L(u_3')$.

In the first half of decoding processing the second time, the receive signal Lcya and the a posteriori likelihood $L(u_3')$ obtained in the second half of decoding processing are regarded as being a new receive signal Lcya', decoding is performed using Lcya' and Lcyb, and the likelihood $(u_3)$ obtained is output. Next, a posteriori likelihood $Le(u_3)$ is found in accordance with the above equation, this is interleaved and $L(u_4')$ is obtained.

In the second half of decoding processing the second time, a signal obtained by interleaving the receive signal Lcya and the posteriori likelihood $L(u_4')$ obtained in the first half of decoding processing are regarded as being a new receive signal Lcya', decoding is performed using Lcya' and Lcyc, and the likelihood $(u_4)$ obtained is output. Next, the a posteriori likelihood $Le(u_4)$ is found in accordance with Equation (9) and this is interleaved to obtain $L(u_5')$.

The above-described decoding processing is subsequently repeated.

Thus, in accordance with the first aspect of the present invention, a memory capacity of just r×m (m: number of states) is required to store the backward probabilities, where $m_1=r$, $m_2=2r$, ... holds. Moreover, since the backward probabilities are calculated from k=N at all times, backward probability $\beta_k(m)$ is calculated accurately to make it possible to raise the precision of MAP decoding.

Further, in accordance with a second aspect of the present invention, a memory capacity of just r×m+(s−1) (m: number of states) is required to store the backward probabilities, where $m_1=r$, $m_2=2r$, ... holds.

Further, in accordance with the second aspect of the present invention, it is so arranged that backward probabilities are calculated in the reverse direction from an Nth backward probability to a first backward probability, the obtained backward probabilities are stored discretely and, if necessary, backward probabilities of the required number are calculated and utilized starting from one of the discretely stored backward probabilities. As a result, backward probability $\beta_k(m)$ can be calculated accurately to make it possible to raise the precision of MAP decoding.

Moreover, in accordance with the second aspect of the present invention, backward probabilities of the required number need not be obtained by calculating backward probabilities from k=N on as the occasion demands. Operation speed can be raised as a result. Further, a prescribed operation speed is obtained without using two arithmetic circuits to calculate backward probability $\beta_k(m)$. Furthermore, backward probability $\beta_k(m)$ need be calculated just one time, thereby providing an advantage in terms of power consumption.

What is claimed is:

1. A decoding method of maximum a posteriori probability for receiving and decoding encoded data obtained by encoding information of length N, characterized by comprising:

performing a backward repetitive operation which is a repetitive operation from back to front in terms of time in order starting from the end of encoded data and, while this operation is being performed, saving first to $m_1$th results of the backward repetitive operation that correspond to first to $m_1$th items of encoded data;

performing a forward repetitive operation which is a repetitive operation from front to back in terms of time in order from first to $m_1$th items of encoded data and, while this operation is being performed, outputting first to $m_1$th operational results as results of decoding;

again performing a backward repetitive operation in order starting from the end of encoded data and, while this operation is being performed, saving ($m_1$+1)th to $m_2$th results of the backward repetitive operation;

performing a forward repetitive operation in order from ($m_1$+1)th to $m_2$th items of encoded data and, while this operation is being performed, outputting ($m_1$+1)th to $m_2$th operational results as results of decoding; and subsequently outputting all results of decoding up to an Nth result in similar fashion.

2. A decoding method of maximum a posteriori probability for calculating a kth forward probability using first to kth items of encoded data obtained by encoding information of length N, obtaining a kth backward probability using Nth to kth items of encoded data, and outputting a kth decoded result using these probabilities, characterized by comprising:

calculating backward probabilities in a reverse direction from an Nth backward probability to a first backward probability and saving an $m_1$th backward probability to the first backward probability;

calculating first forward probabilities, obtaining a first decoded result using the first forward probabilities and the first backward probabilities that have been saved and similarly obtaining second to $m_1$th decoded results;

subsequently calculating backward probabilities in the reverse direction from the Nth backward probability to an ($m_1$+1)th backward probability and saving an $m_2$th backward probability to the ($m_1$+1)th backward probability;

calculating ($m_1$+1)th forward probabilities, obtaining an ($m_1$+1)th decoded result using the ($m_1$+1)th forward probabilities and the ($m_1$+1)th backward probability that has been saved, and similarly obtaining ($m_1$+2)th to $m_2$th decoded results; and subsequently obtaining ($m_2$+1)th to Nth decoded results.

3. A decoding method of maximum a posteriori probability for receiving and decoding encoded data obtained by encoding information of length N, characterized by comprising:

performing a backward repetitive operation which is a repetitive operation from back to front in terms of time in order starting from the end of encoded data and, while this operation is being performed, saving first to $m_1$th, $m_2$th, $m_3$th ... results of the backward repetitive operation that correspond to first to $m_1$th, $m_2$th, $m_3$th ... items of encoded data;

performing a forward repetitive operation which is a repetitive operation from front to back in terms of time in order from first to $m_1$th items of encoded data and, while this operation is being performed, outputting first to $m_1$th operational results as results of decoding;

subsequently saving results while performing $m_2$th to ($m_1$+1)th backward repetitive operations utilizing said $m_2$th result of the backward repetitive operation;

performing a forward repetitive operation in order from ($m_1$+1)th to $m_2$th items of data and, while this operation is being performed, outputting ($m_1$+1)th to $m_2$th operational results as results of decoding; and subsequently outputting all results of decoding up to an Nth result in similar fashion.

4. A decoding method of maximum a posteriori probability for calculating a kth forward probability using first to kth items of encoded data obtained by encoding information of length N, obtaining a kth backward probability using Nth to kth items of encoded data, and outputting a kth decoded result using these probabilities, characterized by comprising:

calculating backward probabilities in a reverse direction from an Nth backward probability to a first backward probability, discretely saving an $m_s$th backward probability, $m_{(s-1)}$th backward probability, ..., $m_2$th backward probability and continuously saving an $m_1$th backward probability to the first backward probability;

calculating first forward probabilities, obtaining a first decoded result using the first forward probabilities and the first backward probabilities that have been saved and similarly obtaining second to $m_1$th decoded results;

subsequently calculating and saving backward probabilities up to an ($m_1$+1)th backward probability starting from the $m_2$th backward probability that has been saved;

calculating ($m_1$+1)th forward probabilities, obtaining an ($m_1$+1)th decoded result using the ($m_1$+1)th forward probabilities and the ($m_1$+1)th backward probability that has been saved, and similarly obtaining ($m_1+2$)th to $m_2$th decoded results; and subsequently obtaining ($m_2+1$)th to Nth decoded results.

5. A decoding method of maximum a posteriori probability according to claim 4, characterized in that the number of backward probabilities saved continuously is about $N^{1/2}$.

6. A decoder for calculating a kth forward probability using first to kth items of encoded data obtained by encoding information of length N, obtaining a kth backward probability using Nth to kth items of encoded data, and outputting a kth decoded result using these probabilities, characterized by comprising:

a backward probability calculation unit for calculating backward probabilities;

a backward probability saving unit for saving backward probabilities that have been calculated;

a forward probability calculation unit for calculating forward probabilities;

a decoded result calculation unit for obtaining a kth decoded result using a kth forward probability and a kth backward probability that has been saved; and a controller for controlling operation timings of said backward probability calculation unit, said forward probability saving unit and said decoded result calculation unit; wherein (1) said backward probability calculation unit calculates backward probabilities in a reverse direction from an Nth backward probability to a first backward probability and saves an $m_1$th backward probability to first backward probability in said backward probability saving unit; said forward probability calculation unit calculates a first forward probability to an $m_1$th forward probability; and said decoded result calculation unit calculates a kth decoded result using the kth forward probability ($k=1$ to $m_1$) that has been calculated and the kth backward probability that has been saved; (2) said backward probability calculation unit subsequently calculates backward probabilities in the reverse direction from the Nth backward probability to an ($m_1+1$)th backward probability and saves an $m_2$th backward probability to the ($m_1+1$)th backward probability in said backward probability saving unit; said forward probability calculation unit calculates an ($m_1+1$)th forward probability to an $m_2$th forward probability; and said decoded result calculation unit calculates a kth decoded result using the kth forward probability ($k=m_1+1$ to $m_2$) that has been calculated and the kth backward probability that has been saved and (3) subsequently similarly obtains ($m_2+1$)th to Nth decoded results.

7. A decoder for calculating a kth forward probability using first to kth items of encoded data obtained by encoding information of length N, obtaining a kth backward probability using Nth to kth items of encoded data, and outputting a kth decoded result using these probabilities, characterized by comprising:

a backward probability calculation unit for calculating backward probabilities;

a backward probability saving unit for saving backward probabilities that have been calculated;

a forward probability calculation unit for calculating forward probabilities;

a decoded result calculation unit for obtaining a kth decoded result using a kth forward probability and a kth backward probability that has been saved; and a controller for controlling operation timings of said backward probability calculation unit, said forward probability saving unit and said decoded result calculation unit; wherein (1) said backward probability calculation unit calculates backward probabilities in a reverse direction from an Nth backward probability to a first backward probability, discretely saves an $m_s$th backward probability, $m_{(s-1)}$th backward probability, ..., $m_2$th backward probability in said backward probability saving unit and continuously saves an $m_1$th backward probability to the first backward probability; said forward probability calculation unit calculates a first forward probability to an $m_1$th forward probability; and said decoded result calculation unit calculates a kth decoded result using the kth forward probability ($k=1$ to $m_1$) that has been calculated and the kth backward probability that has been saved; (2) said backward probability calculation unit subsequently calculates, and saves in said backward probability saving unit, backward probabilities up to an ($m_1+1$)th backward probability starting from the $m_2$th backward probability that has been saved; said forward probability calculation unit calculates an ($m_1+1$)th forward probability to an $m_2$th forward probability; and said decoded result calculation unit calculates a kth decoded result using the kth forward probability ($k=m_1+1$ to $m_2$) that has been calculated and the kth backward probability that has been saved and (3) subsequently similarly obtains ($m_2+1$)th to Nth decoded results.

8. A decoder according to claim 7, characterized in that the number of backward probabilities saved continuously is about $N^{1/2}$.

* * * * *

UNITED STATES PATENT AND TRADEMARK OFFICE
CERTIFICATE OF CORRECTION

PATENT NO. : 6,563,890 B2
DATED : May 13, 2003
INVENTOR(S) : K. Obuchi et al.

It is certified that error appears in the above-identified patent and that said Letters Patent is hereby corrected as shown below:

Title page,
Delete Item [30], Foreign Application Priority Data, and add Item [63]:
-- [63] Related U.S. Application Data
PCT/JP99/00963 03/01/1999, filed March 1, 1999, pending. --

Signed and Sealed this

Seventh Day of October, 2003

JAMES E. ROGAN
*Director of the United States Patent and Trademark Office*